US012575226B2

(12) United States Patent　　(10) Patent No.:　US 12,575,226 B2
Takayama　　　　　　　　　　　　(45) Date of Patent:　　Mar. 10, 2026

(54) NITRIDE SEMICONDUCTOR LIGHT-EMITTING ELEMENT

(71) Applicant: Nuvoton Technology Corporation Japan, Kyoto (JP)

(72) Inventor: Toru Takayama, Toyama (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 352 days.

(21) Appl. No.: 18/447,097

(22) Filed: Aug. 9, 2023

(65) Prior Publication Data

US 2023/0387352 A1　　Nov. 30, 2023

Related U.S. Application Data

(63) Continuation-in-part of application No. PCT/JP2022/003539, filed on Jan. 31, 2022.

(30) Foreign Application Priority Data

Feb. 12, 2021　　(JP) ................................. 2021-020972

(51) Int. Cl.
*H10H 20/825*　　(2025.01)
*H10H 20/812*　　(2025.01)
*H10H 29/14*　　(2025.01)

(52) U.S. Cl.
CPC ...... *H10H 20/8252* (2025.01); *H10H 20/812* (2025.01); *H10H 29/14* (2025.01)

(58) Field of Classification Search
CPC .. H10H 20/8252; H10H 20/812; H10H 29/14; H10H 20/825; H01S 5/20; H01S 5/323; H01S 5/343
See application file for complete search history.

(56) References Cited

U.S. PATENT DOCUMENTS

2014/0294029 A1* 10/2014 Masui ............... H01S 5/320225
　　　　　　　　　　　　　　　　　　　372/45.012
2019/0074665 A1* 3/2019 Takayama .......... H10H 20/8162
2020/0287354 A1* 9/2020 Sato ..................... H10H 20/825
2021/0184434 A1* 6/2021 Watanabe ............. H01S 5/3213

FOREIGN PATENT DOCUMENTS

JP　　　2014-131019 A　　7/2014

OTHER PUBLICATIONS

International Search Report dated Mar. 8, 2022 issued in International Patent Application No. PCT/JP2022/003539, with English translation.

* cited by examiner

*Primary Examiner* — Mark W Tornow
(74) *Attorney, Agent, or Firm* — Rimon P.C.

(57) ABSTRACT

A nitride semiconductor light-emitting element includes a semiconductor stack. The semiconductor stack includes an N-type first cladding layer, an N-side guide layer, an active layer, a P-side first guide layer, a P-side second guide layer, and a P-type cladding layer. The band gap energy of the P-side second guide layer is larger than the band gap energy of the N-side guide layer. The band gap energy of the N-side guide layer is larger than or equal to the band gap energy of the P-side first guide layer. Tn1<Tp1+Tp2, where Tp1 is the thickness of the P-side first guide layer, Tp2 is the thickness of the P-side second guide layer, and Tn1 is the thickness of the N-side guide layer.

20 Claims, 19 Drawing Sheets

NITRIDE SEMICONDUCTOR LIGHT-EMITTING ELEMENT

CROSS REFERENCE TO RELATED APPLICATIONS

This is a continuation-in-part application of PCT International Application No. PCT/JP2022/003539 filed on Jan. 31, 2022, designating the United States of America, which is based on and claims priority of Japanese Patent Application No. 2021-020972 filed on Feb. 12, 2021. The entire disclosures of the above-identified applications, including the specifications, drawings, and claims are incorporated herein by reference in their entirety.

FIELD

The present disclosure relates to nitride semiconductor light-emitting elements.

BACKGROUND

Conventionally, nitride semiconductor light-emitting elements have been used as light sources in, for example, processing equipment. There is a demand for increased output and efficiency in light sources used in processing equipment. One known technique for increasing the efficiency of nitride semiconductor light-emitting elements is to reduce the operating voltage (for example, see Patent Literature (PTL) 1).

CITATION LIST

Patent Literature

PTL 1: Japanese Unexamined Patent Application Publication No. 2014-131019

SUMMARY

Technical Problem

In nitride semiconductor light-emitting elements, reducing the thickness of the P-type cladding layer is effective in reducing the operating voltage. However, reducing the thickness of the P-type cladding layer moves the peak of the light intensity distribution in the stacking direction (i.e., the growth direction of each semiconductor layer) toward the N-type cladding layer from the active layer. This reduces the optical confinement factor of the active layer, which in turn reduces the thermal saturation level of the light output. It is therefore difficult to achieve a high-output nitride semiconductor light-emitting element.

The present disclosure has an object to provide a nitride semiconductor light-emitting element with reduced operating voltage and an increased optical confinement factor of the active layer.

Solution to Problem

In order to overcome the above problem, a nitride semiconductor light-emitting element according to one aspect of the present disclosure includes a semiconductor stack and emits light from an end face of the semiconductor stack, the end face being perpendicular to a stacking direction of the semiconductor stack. The semiconductor stack includes: an N-type first cladding layer; an N-side guide layer disposed above the N-type first cladding layer; an active layer disposed above the N-side guide layer, having a quantum well structure including a well layer and a barrier layer; a P-side first guide layer disposed above the active layer; a P-side second guide layer disposed above the P-side first guide layer; and a P-type cladding layer disposed above the P-side second guide layer. A band gap energy of the P-side second guide layer is larger than a band gap energy of the N-side guide layer, the band gap energy of the N-side guide layer is larger than or equal to a band gap energy of the P-side first guide layer, and $Tn1 < Tp1 + Tp2$, where $Tp1$ is a thickness of the P-side first guide layer, $Tp2$ is a thickness of the P-side second guide layer, and $Tn1$ is a thickness of the N-side guide layer.

In one aspect of the nitride semiconductor light-emitting element according to the present disclosure, an average refractive index of the P-side first guide layer and the P-side second guide layer may be less than an average refractive index of the N-side guide layer.

In one aspect of the nitride semiconductor light-emitting element according to the present disclosure, the P-side first guide layer may include $In_{Xp1}Ga_{1-Xp1}N$, the N-side guide layer may include $In_{Xn1}Ga_{1-Xn1}N$, and $Xn1 \leq Xp1$ may hold true.

In one aspect of the nitride semiconductor light-emitting element according to the present disclosure, $Xn1 < Xp1$ may hold true.

In one aspect of the nitride semiconductor light-emitting element according to the present disclosure, the P-side second guide layer may include $In_{Xp2}Ga_{1-Xp2}N$, and $Xp2 < Xn1$ may hold true.

In one aspect of the nitride semiconductor light-emitting element according to the present disclosure, the barrier layer may include $In_{Xb}Ga_{1-Xb}N$, and $Xp1 < Xb$ may hold true.

In one aspect of the nitride semiconductor light-emitting element according to the present disclosure, the band gap energy of the N-side guide layer may be larger than the band gap energy of the P-side first guide layer.

In one aspect of the nitride semiconductor light-emitting element according to the present disclosure, $Tp1 < Tp2$ may hold true.

In one aspect of the nitride semiconductor light-emitting element according to the present disclosure, $Tp1 < Tn1$ may hold true.

In one aspect of the nitride semiconductor light-emitting element according to the present disclosure, a peak of a light intensity distribution in the stacking direction may be located in the active layer.

In one aspect of the nitride semiconductor light-emitting element according to the present disclosure, an impurity concentration of the P-type cladding layer may be lower at an end portion closer to the active layer than at an end portion farther from the active layer.

In one aspect, the nitride semiconductor light-emitting element according to the present disclosure may include an electron barrier layer disposed between the P-side second guide layer and the P-type cladding layer, and the electron barrier layer may include an Al composition variation region in which an Al composition ratio monotonically increases with increasing distance from the active layer.

In one aspect of the nitride semiconductor light-emitting element according to the present disclosure, the N-type first cladding layer and the P-type cladding layer may include Al, and $Ync > Ypc$ may hold true, where $Ync$ is an Al composition ratio of the N-type first cladding layer and $Ypc$ is an Al composition ratio of the P-type cladding layer.

In one aspect of the nitride semiconductor light-emitting element according to the present disclosure, a thickness of the P-type cladding layer may be 460 nm or less.

In one aspect, the nitride semiconductor light-emitting element according to the present disclosure may include a light-transmissive conductive film disposed above the P-type cladding layer.

In one aspect, the nitride semiconductor light-emitting element according to the present disclosure may include an N-type second cladding layer disposed between the N-type first cladding layer and the N-side guide layer, and a band gap energy of the N-type second cladding layer may be smaller than a band gap energy of the N-type first cladding layer and larger than the band gap energy of the P-side second guide layer.

In one aspect, the nitride semiconductor light-emitting element according to the present disclosure may include a plurality of light-emitting portions arranged in a linear array.

In one aspect of the nitride semiconductor light-emitting element according to the present disclosure, a reflectance of the end face of the semiconductor stack may be 0.1% or less.

In one aspect, the nitride semiconductor light-emitting element according to the present disclosure may include a P-side electrode disposed above the semiconductor stack, and the P-side electrode may include Ag.

Advantageous Effects

The present disclosure can provide a nitride semiconductor light-emitting element with reduced operating voltage and an increased optical confinement factor of the active layer.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

The following describes embodiments of the present disclosure with reference to the drawings. The embodiments described below each show a specific example of the present disclosure. The numerical values, shapes, materials, elements, the arrangement and connection of the elements, etc., indicated in the following embodiments are mere examples, and therefore do not intend to limit the present disclosure.

The figures are schematic illustrations and are not necessarily precise depictions. Accordingly, the figures are not necessarily to scale. Moreover, in the figures, elements that are essentially the same share like reference signs. Accordingly, duplicate description is omitted or simplified.

Moreover, in the specification, the terms "above" and "below" do not refer to the upward (vertically upward) direction and downward (vertically downward) direction in terms of absolute spatial recognition, but are used as terms defined by relative positional relationships based on the stacking order of the stacked structure. Furthermore, the terms "above" and "below" are applied not only when two elements are disposed with a gap therebetween or when a separate element is interposed between two elements, but also when two elements are disposed in contact with each other.

Embodiment 1

The nitride semiconductor light-emitting element according to Embodiment 1 will be described.

[1-1. Overall Configuration]

Figure 1:
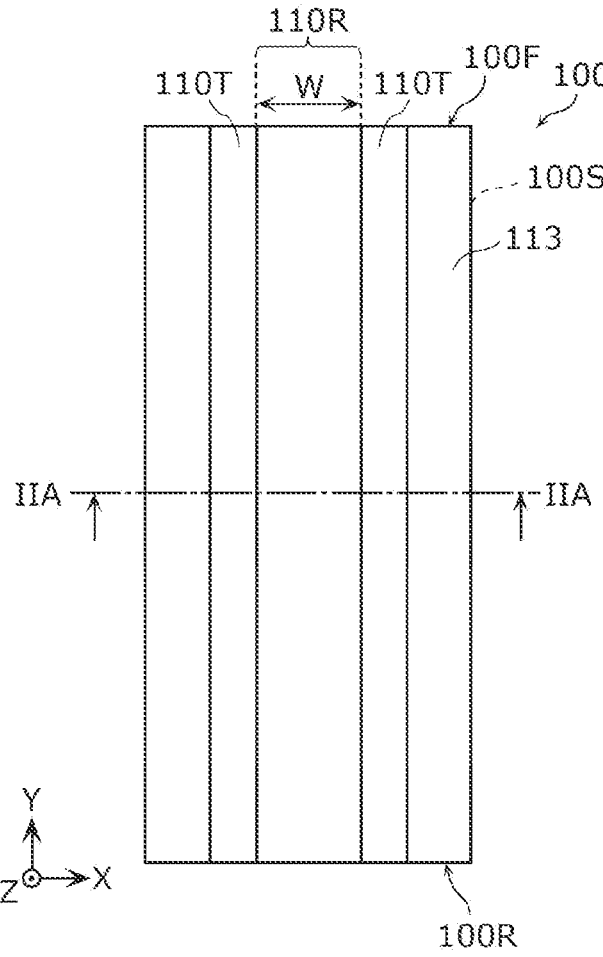
FIG. 1 is a schematic plan view of the overall configuration of a nitride semiconductor light-emitting element according to Embodiment 1.
Figure 2A:
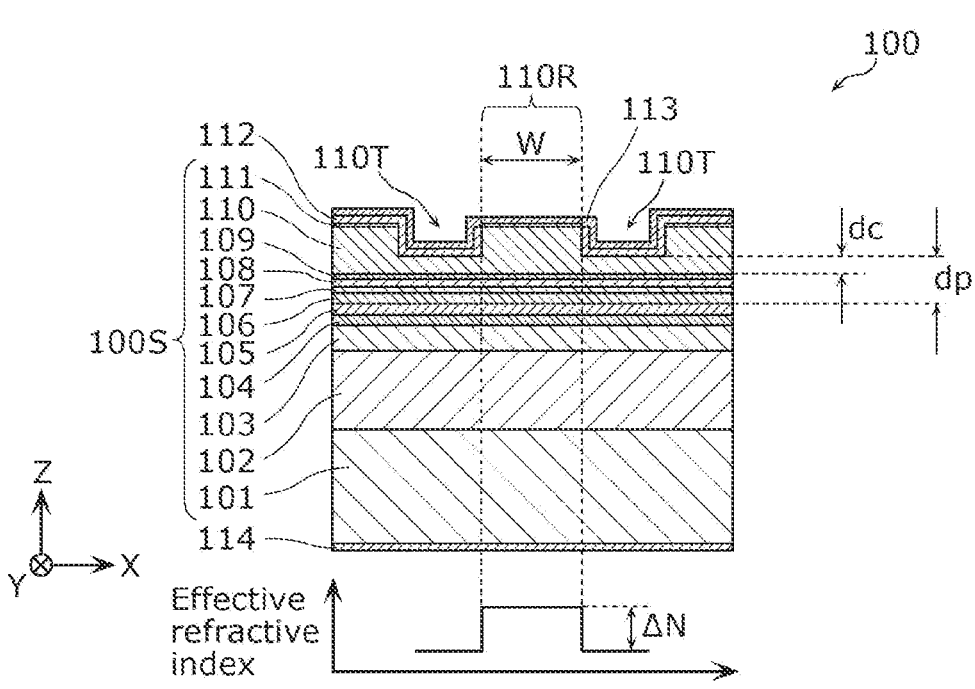
FIG. 2A is a cross-sectional view of the overall configuration of the nitride semiconductor light-emitting element according to Embodiment 1.
Figure 2B:
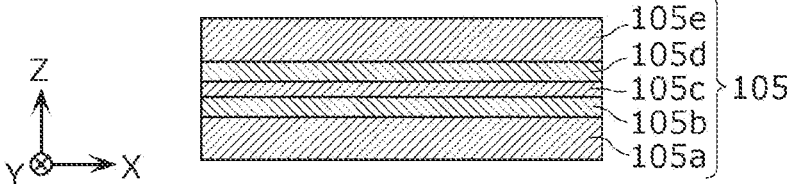
FIG. 2B is a schematic cross-sectional view illustrating the configuration of an active layer included in the nitride semiconductor light-emitting element according to Embodiment 1.

First, the overall configuration of the nitride semiconductor light-emitting element according to the present embodiment will be described with reference to FIG. 1, FIG. 2A, and FIG. 2B. FIG. 1 and FIG. 2A are a schematic plan view and a cross-sectional view, respectively, of the overall configuration of nitride semiconductor light-emitting element 100 according to the present embodiment. FIG. 2A illustrates a cross section taken at line IIA-IIA in FIG. 1. FIG. 2B is a schematic cross-sectional view illustrating the configuration of active layer 105 included in nitride semiconductor light-emitting element 100 according to the present embodiment. Note that the figures illustrate X-, Y-, and Z-axes that are orthogonal to each other. The X-, Y-, and Z-axes are oriented in a right-handed Cartesian coordinate system. The stacking direction of nitride semiconductor light-emitting element 100 is parallel to the Z-axis direction, and the main emission direction of the light (laser beam) is parallel to the Y-axis direction.

As illustrated in FIG. 2A, nitride semiconductor light-emitting element 100 includes semiconductor stack 100S including nitride semiconductor layers, and emits light from end face 100F (see FIG. 1), of semiconductor stacked body 100S, that is perpendicular to the stacking direction (i.e., the Z-axis direction). In the present embodiment, nitride semiconductor light-emitting element 100 is a semiconductor laser element including two end faces, 100F and 100R, forming a resonator. End face 100F is the front end face that emits the laser beam, and end face 100R is the rear end face that is more reflective than end face 100F. In the present embodiment, the reflectance of end face 100F is 16% and the reflectance of end face 100R is 95%. The resonator length (i.e., the distance between end face 100F and end face 100R) of nitride semiconductor light-emitting element 100 according to the present embodiment is approximately 1200 μm.

As illustrated in FIG. 2A, nitride semiconductor light-emitting element 100 includes semiconductor stack 100S, current blocking layer 112, P-side electrode 113, and N-side electrode 114. Semiconductor stack 100S includes substrate 101, N-type first cladding layer 102, N-type second cladding layer 103, N-side guide layer 104, active layer 105, P-side first guide layer 106, P-side second guide layer 107, intermediate layer 108, electron barrier layer 109, P-type cladding layer 110, contact layer 111.

Substrate 101 is a plate-shaped member that serves as the base of nitride semiconductor light-emitting element 100. In the present embodiment, substrate 101 is an N-type GaN substrate.

N-type first cladding layer 102 is one example of an N-type cladding layer disposed above substrate 101. N-type first cladding layer 102 is a layer with a smaller refractive index and a larger band gap energy than active layer 105. In the present embodiment, N-type first cladding layer 102 is an N-type $Al_{0.35}Ga_{0.965}N$ layer with a thickness of 1200 nm. N-type first cladding layer 102 is doped with Si at a concentration of $1 \times 10^{18}$ cm$^{-3}$ as an impurity.

N-type second cladding layer 103 is one example of an N-type cladding layer disposed above substrate 101. In the present embodiment, N-type second cladding layer 103 is disposed above N-type first cladding layer 102. N-type second cladding layer 103 is a layer with a smaller refractive index and a larger band gap energy than active layer 105. In the present embodiment, N-type second cladding layer 103 is an N-type GaN layer with a thickness of 100 nm. N-type second cladding layer 103 is doped with Si at a concentration of $1 \times 10^{18}$ cm$^{-3}$ as an impurity.

N-side guide layer 104 is an optical guide layer disposed above N-type second cladding layer 103. N-side guide layer 104 has a larger refractive index and a smaller band gap energy than N-type first cladding layer 102 and N-type second cladding layer 103. In the present embodiment, N-side guide layer 104 is an undoped $In_{0.04}Ga_{0.96}N$ layer with a thickness of 160 nm.

Active layer 105 is disposed above N-side guide layer 104 and is a light-emitting layer having a quantum well structure. As illustrated in FIG. 2B, in the present embodiment, active layer 105 includes well layers 105b and 105d and barrier layers 105a, 105c, and 105e.

Barrier layer 105a is disposed above N-side guide layer 104 and functions as a barrier in the quantum well structure. In the present embodiment, barrier layer 105a is an undoped $In_{0.05}Ga_{0.95}N$ layer with a thickness of 7 nm.

Well layer 105b is disposed above barrier layer 105a and functions as a well in the quantum well structure. Well layer 105b is disposed between barrier layer 105a and barrier layer 105c. In the present embodiment, well layer 105b is an undoped $In_{0.18}Ga_{0.82}N$ layer with a thickness of 3 nm.

Barrier layer 105c is disposed above well layer 105b and functions as a barrier in the quantum well structure. In the present embodiment, barrier layer 105c is an undoped $In_{0.05}Ga_{0.95}N$ layer with a thickness of 7 nm.

Well layer 105d is disposed above barrier layer 105c and functions as a well in the quantum well structure. Well layer 105$d$ is disposed between barrier layer 105$c$ and barrier layer 105$e$. In the present embodiment, well layer 105$d$ is an undoped $In_{0.18}Ga_{0.82}N$ layer with a thickness of 3 nm.

Barrier layer 105$e$ is disposed above well layer 105$d$ and functions as a barrier in the quantum well structure. In the present embodiment, barrier layer 105$e$ is an undoped $In_{0.05}Ga_{0.95}N$ layer with a thickness of 5 nm.

P-side first guide layer 106 is an optical guide layer disposed above active layer 105. P-side first guide layer 106 has a larger refractive index and a smaller band gap energy than P-type cladding layer 110. In the present embodiment, P-side first guide layer 106 is an undoped $In_{0.045}Ga_{0.955}N$ layer with a thickness of 80 nm.

P-side second guide layer 107 is an optical guide layer disposed above P-side first guide layer 106. P-side second guide layer 107 has a larger refractive index and a smaller band gap energy than P-type cladding layer 110. In the present embodiment, P-side second guide layer 107 is an undoped $In_{0.01}Ga_{0.99}N$ layer with a thickness of 195 nm.

Intermediate layer 108 is a layer disposed above active layer 105. In the present embodiment, intermediate layer 108 is disposed between P-side second guide layer 107 and electron barrier layer 109 to reduce stress caused by the difference in lattice constants between P-side second guide layer 107 and electron barrier layer 109. This can inhibit the generation of crystal defects in nitride semiconductor light-emitting element 100. In the present embodiment, intermediate layer 108 is an undoped GaN layer with a thickness of 20 nm.

Electron barrier layer 109 is disposed above active layer 105 and is a nitride semiconductor layer including at least Al. In the present embodiment, electron barrier layer 109 is disposed between intermediate layer 108 and P-type cladding layer 110. Electron barrier layer 109 is a P-type AlGaN layer with a thickness of 5 nm. Electron barrier layer 109 has an Al composition ratio gradient region where the Al composition ratio monotonically increases with increasing proximity to P-type cladding layer 110. Here, the configuration in which the Al composition ratio monotonically increases includes a configuration including a region in which the Al composition ratio is constant in the stacking direction. For example, the configuration in which the Al composition ratio monotonically increases includes a configuration in which the Al composition ratio increases in steps. In electron barrier layer 109 according to the present embodiment, the entire electron barrier layer 109 is a region of increased Al composition ratio, where the Al composition ratio increases at a constant rate of change in the stacking direction. More specifically, the composition of electron barrier layer 109 near the interface with intermediate layer 108 is $Al_{0.02}Ga_{0.98}N$, and the Al composition ratio increases monotonically with increasing proximity to P-type cladding layer 110 such that the composition near the interface with P-type cladding layer 110 is $Al_{0.36}Ga_{0.64}N$. Electron barrier layer 109 is doped with Mg at a concentration of $1\times10^{19}$ cm$^{-3}$ as an impurity.

Electron barrier layer 109 can inhibit electrons from leaking from active layer 105 to P-type cladding layer 110. Moreover, by electron barrier layer 109 including an Al composition variation region in which the Al composition ratio monotonically increases, the electric potential barrier in the valence band of electron barrier layer 109 can be reduced more so than when the Al composition ratio is uniform. Holes can therefore easily flow from P-type cladding layer 110 to active layer 105. Therefore, even when the total thickness of P-side first guide layer 106 and P-side second guide layer 107, which are undoped layers, is large— as is the case in the present embodiment—it is possible to inhibit an increase in the electrical resistance of nitride semiconductor light-emitting element 100. This makes it possible to reduce the operating voltage of nitride semiconductor light-emitting element 100. Moreover, since self-heating during operation of nitride semiconductor light-emitting element 100 can be reduced, the temperature characteristics of nitride semiconductor light-emitting element 100 can be improved. High-output operation of nitride semiconductor light-emitting element 100 is thus possible.

P-type cladding layer 110 is disposed above active layer 105. In the present embodiment, P-type cladding layer 110 is disposed between electron barrier layer 109 and contact layer 111. P-type cladding layer 110 is a layer with a smaller refractive index and a larger band gap energy than active layer 105. The thickness of P-type cladding layer 110 may be 460 nm or less. This makes it possible to inhibit the electrical resistance of nitride semiconductor light-emitting element 100. This in turn makes it possible to reduce the operating voltage of nitride semiconductor light-emitting element 100. Moreover, since self-heating during operation of nitride semiconductor light-emitting element 100 can be reduced, the temperature characteristics of nitride semiconductor light-emitting element 100 can be improved. High-power operation of nitride semiconductor light-emitting element 100 is thus possible. In order for P-type cladding layer 110 to sufficiently function as a cladding layer, in nitride semiconductor light-emitting element 100 according to the present embodiment, the thickness of P-type cladding layer 110 may be 200 nm or more. Additionally, the thickness of P-type cladding layer 110 may be 250 nm or more. In the present embodiment, P-type cladding layer 110 is a P-type $Al_{0.035}Ga_{0.965}N$ layer with a thickness of 450 nm. P-type cladding layer 110 is doped with Mg as an impurity. The impurity concentration of P-type cladding layer 110 is lower at the end portion closer to active layer 105 than at the end portion farther from active layer 105. More specifically, P-type cladding layer 110 includes a 150 nm thick P-type $Al_{0.035}Ga_{0.965}N$ layer doped with Mg at a concentration of $2\times10^{18}$ cm$^{-3}$ arranged on the side closer to active layer 105, and a 300 nm thick P-type $Al_{0.035}Ga_{0.965}N$ layer doped with Mg at a concentration of $1\times10^{19}$ cm$^{-3}$ arranged on the side farther from active layer 105.

Ridge 110R is formed in P-type cladding layer 110 of nitride semiconductor light-emitting element 100. Two trenches 110T disposed along ridge 110R and extending in the Y-axis direction are also formed in P-type cladding layer 110. In the present embodiment, ridge width W is approximately 30 µm. As illustrated in FIG. 2A, the distance between the bottom edge of ridge 110R (i.e., the bottom of trench 110T) and active layer 105 is dp. The thickness of P-type cladding layer 110 at the bottom edge of ridge 110R (i.e., the distance between the bottom edge of ridge 110R and the interface of P-type cladding layer 110 and electron barrier layer 109) is dc.

Contact layer 111 is disposed above P-type cladding layer 110 and is in ohmic contact with P-side electrode 113. In the present embodiment, contact layer 111 is a P-type GaN layer with a thickness of 100 nm. Contact layer 111 is doped with Mg at a concentration of $1\times10^{20}$ cm$^{-3}$ as an impurity.

Current blocking layer 112 is an insulating layer that is disposed above P-type cladding layer 110 and is light transmissive with respect to light from active layer 105. Current blocking layer 112 is disposed on the top surface of P-type cladding layer 110, except for the top surface of ridge 110R. In the present embodiment, current blocking layer 112 is a $SiO_2$ layer.

P-side electrode 113 is a conductive layer disposed above semiconductor stack 100S. In the present embodiment, P-side electrode 113 is disposed above contact layer 111 and current blocking layer 112. P-side electrode 113 is, for example, a single-layer or multilayer film formed of at least one of Ag, Cr, Ti, Ni, Pd, Pt, or Au.

P-side electrode 113 may include Ag. Ag has a significantly lower refractive index with respect to light in the UV to IR range than P-type cladding layer 110 and contact layer 111. The inclusion of Ag in P-side electrode 113 inhibits light that propagates in the waveguide between the two end faces 100F and 100R from seeping into P-side electrode 113, making it possible to reduce waveguide loss generated at P-side electrode 113. Ag has a refractive index of 0.5 or less in the 325 nm to 1500 nm wavelength range, inclusive, and a refractive index of 0.2 or less in the 360 nm to 950 nm wavelength range, inclusive. Moreover, Ag has a lower rate of absorption with respect to light in the UV to IR range than other metal films such as Au. Therefore, the inclusion of Ag in P-side electrode 113 reduces light loss at P-side electrode 113.

When P-side electrode 113 includes Ag, even when the thickness of P-type cladding layer 110 is 460 nm or less, light can be inhibited from seeping into P-side electrode 113, making it possible to inhibit waveguide loss while reducing the series resistance of nitride semiconductor light-emitting element 100. This in turn makes it possible to reduce operating voltage and operating current.

When P-side electrode 113 includes Ag, the thickness of P-type cladding layer 110 may be 400 nm or less. This further reduces the operating voltage and operating current. Furthermore, even with such a thin P-type cladding layer 110, light can be confined below P-side electrode 113 and light absorption at P-side electrode 113 can be reduced, making it possible to inhibit waveguide loss.

The thickness of P-type cladding layer 110 may be greater than the total thickness Tp1+Tp2 of P-side first guide layer 106 and the P-side second guide layer and thickness Tn1 of N-side guide layer 104. This allows P-type cladding layer 110 to have a thickness sufficient enough to confine light below P-side electrode 113, making it possible to inhibit waveguide loss. When P-side electrode 113 includes Ag, for example, the thickness of P-type cladding layer 110 may be 200 nm to 400 nm, inclusive. This allows the operating voltage and operating current to be reduced while inhibiting waveguide loss.

Layers with a large Al composition ratio, such as P-type cladding layer 110, have a large strain on substrate 101, which is made of N-type GaN. Since the total Al content in P-type cladding layer 110 can be reduced by reducing the thickness of P-type cladding layer 110, it is possible to reduce the strain on substrate 101 by P-type cladding layer 110. Accordingly, it is possible to inhibit nitride semiconductor light-emitting element 100 from cracking due to the strain from P-type cladding layer 110.

The Ag in P-side electrode 113 may be, for example, in ohmic contact with contact layer 111. Stated differently, P-side electrode 113 may include an Ag film in ohmic contact with contact layer 111. Since this allows light to be confined below contact layer 111, light loss at P-side electrode 113 can be further reduced.

N-side electrode 114 is a conductive layer disposed below substrate 101 (i.e., on the main surface of substrate 101 opposite the main surface of substrate 101 where the remainder of semiconductor stack 100S is disposed). N-side electrode 114 is, for example, a single-layer or multilayer film formed of at least one of Cr, Ti, Ni, Pd, Pt, or Au.

Due to nitride semiconductor light-emitting element 100 having the above configuration, there is an effective refractive index difference ΔN between the portion below ridge 110R and the portions below trenches 110T, as illustrated in FIG. 2A. This allows the light generated in the portion of active layer 105 below ridge 110R to be confined in the horizontal direction (i.e., in the X-axis direction).

[1-2. Light Intensity Distribution and Light Output Stability]

Next, the light intensity distribution and the light output stability of nitride semiconductor light-emitting element 100 according to the present embodiment will be described.

Figure 3:
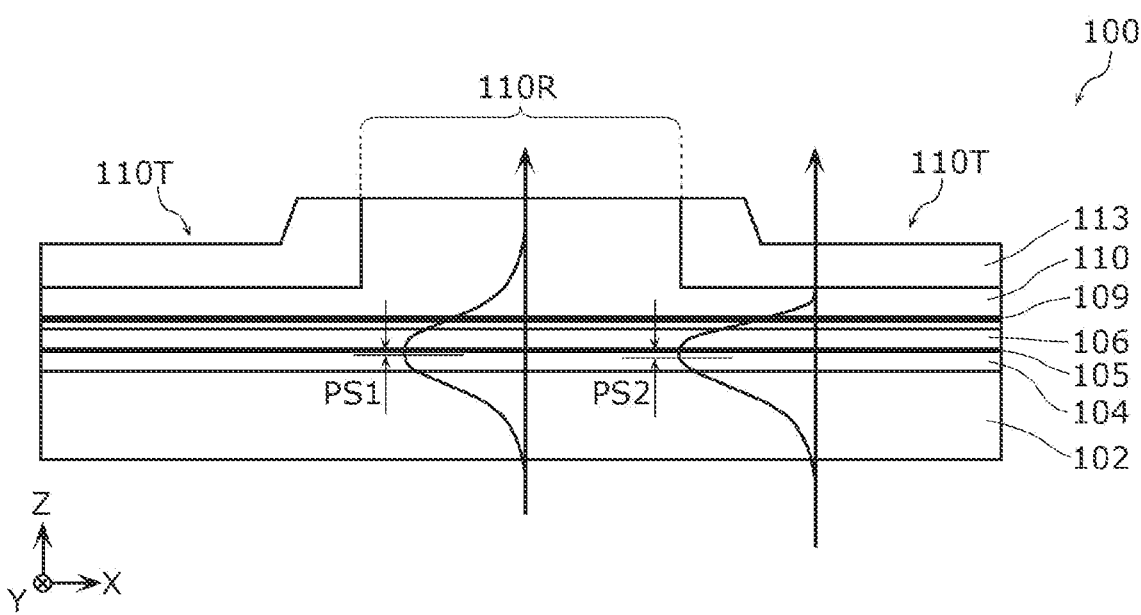
FIG. 3 is a schematic diagram outlining the light intensity distribution in the stacking direction of the nitride semiconductor light-emitting element according to Embodiment 1.

First, the light intensity distribution in the stacking direction (the Z-axis direction in the figures) of nitride semiconductor light-emitting element 100 according to the present embodiment will be described with reference to FIG. 3. FIG. 3 is a schematic diagram outlining the light intensity distribution in the stacking direction of nitride semiconductor light-emitting element 100 according to the present embodiment. FIG. 3 includes a schematic cross-sectional view of nitride semiconductor light-emitting element 100 and a graph outlining the light intensity distribution in the stacking direction at positions corresponding to ridge 110R and trench 110T.

Figure 4:
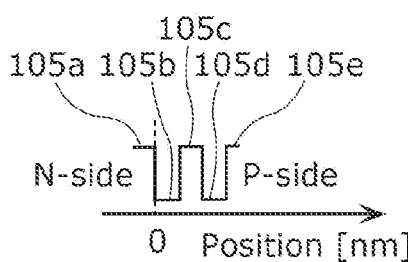
FIG. 4 is a graph illustrating coordinates of positions in the stacking direction of the nitride semiconductor light-emitting element according to Embodiment 1.

In nitride semiconductor light-emitting elements, light is generally generated in the active layer, but since the light intensity distribution in the stacking direction depends on the stacked structure, the peak of the light intensity distribution is not necessarily located in the active layer. Since the stacked structure of nitride semiconductor light-emitting element 100 according to the present embodiment differs between the portion below ridge 110R and the portions below trenches 110T, the light intensity distribution also differs between the portion below ridge 110R and the portions below trenches 110T. As illustrated in FIG. 3, the peak position of the light intensity distribution in the stacking direction at the horizontal (i.e., X-axis) center of the portion below ridge 110R is PS1. The peak position of the light intensity distribution in the stacking direction in the portion below trench 110T is PS2. Next, positions PS1 and PS2 will be described with reference to FIG. 4. FIG. 4 is a graph illustrating coordinates of positions in the stacking direction of nitride semiconductor light-emitting element 100 according to the present embodiment. As illustrated in FIG. 4, the coordinates of the position in the stacking direction of the N-side end face of well layer 105b of active layer 105, i.e., the end face of well layer 105b that is closer to N-side guide layer 104, are set to zero, with the downward direction (toward N-side guide layer 104) being the negative direction of coordinates and the upward direction (toward P-side first guide layer 106) being the positive direction of coordinates. The absolute value of the difference between positions PS1 and PS2 is denoted as peak position difference ΔP.

In nitride semiconductor light-emitting element 100 according to the present embodiment, the thickness of P-type cladding layer 110 is set relatively thin to reduce the operating voltage. Accordingly, the height of ridge 110R (i.e., the height of ridge 110R from the bottom of trench 110T) is set relatively low. Generally, in light-emitting elements with this configuration, the peak position of the light intensity distribution in the stacking direction shifts from the active layer toward the N-type cladding layer. This reduces the optical confinement factor of the active layer, which in turn reduces the thermal saturation level of the light output. High-output operation of the semiconductor light-emitting element is therefore difficult. In the present embodiment, the band gap energy of P-side second guide layer 107 is larger than the band gap energy of N-side guide layer 104, and the band gap energy of N-side guide layer 104 is larger than or equal to the band gap energy of P-side first guide layer 106. Moreover, Tn1<Tp1+Tp2 (Expression 1), where Tp1 is the thickness of P-side first guide layer 106, Tp2 is the thickness of P-side second guide layer 107, and Tn1 is the thickness of N-side guide layer 104.

In this way, in nitride semiconductor light-emitting element 100, the band gap energy of N-side guide layer 104 is larger than or equal to the band gap energy of P-side first guide layer 106. More specifically, P-side first guide layer 106 includes $In_{xp1}Ga_{1-xp1}N$, N-side guide layer 104 includes $In_{xn1}Ga_{1-xn1}N$, and Xn1≤Xp1 (Expression 2). The refractive index of N-side guide layer 104 is thus less than or equal to the refractive index of P-side first guide layer 106. This makes it possible to move the light intensity distribution toward P-side first guide layer 106 from active layer 105, compared to when the refractive index of N-side guide layer 104 is greater than the refractive index of P-side first guide layer 106, for example.

In the present embodiment, in regard to In composition ratios Xn1 and Xp1 of N-side guide layer 104 and P-side first guide layer 106 described above, Xn1<Xp1 (Expression 3). More specifically, N-side guide layer 104 is an $In_{0.04}Ga_{0.96}N$ layer and P-side first guide layer 106 is an $In_{0.045}Ga_{0.955}N$ layer. Here, in the InGaN layer, as the In composition ratio increases, the band gap energy decreases and the refractive index increases. The band gap energy of N-side guide layer 104 is therefore larger than the band gap energy of P-side first guide layer 106. In other words, the refractive index of N-side guide layer 104 is less than the refractive index of P-side first guide layer 106. This makes it possible to move the light intensity distribution toward P-side first guide layer 106 from active layer 105, compared to when the refractive index of N-side guide layer 104 is greater than or equal to the refractive index of P-side first guide layer 106, for example.

As mentioned above, the sum of thickness Tp1 of P-side first guide layer 106 and thickness Tp2 of P-side second guide layer 107 is greater than thickness Tn1 of N-side guide layer 104. Thus, by making the sum of the thicknesses of P-side first guide layer 106 and P-side second guide layer 107, which have relatively high refractive indices, greater than thickness Tn1 of N-side guide layer 104, the light intensity distribution can be moved toward P-side first guide layer 106 from active layer 105, compared to when the sum of the thicknesses of P-side first guide layer 106 and P-side second guide layer 107 is less than or equal to thickness Tn1 of N-side guide layer 104. It is therefore possible to inhibit the peak of the light intensity distribution in the stacking direction from shifting toward N-type second cladding layer 103 from active layer 105. The band gap energy of P-side second guide layer 107 is therefore larger than the band gap energy of N-side guide layer 104. In other words, the refractive index of P-side second guide layer 107 is less than the refractive index of N-side guide layer 104. This makes it possible to inhibit the light intensity distribution from moving too far toward P-type cladding layer 110 from active layer 105.

Moreover, as mentioned above, the band gap energy of P-side second guide layer 107 is larger than the band gap energy of N-side guide layer 104. More specifically, P-side second guide layer 107 includes $In_{xp2}Ga_{1-xp2}N$, and in regard to In composition ratio Xp2 of P-side second guide layer 107 and In composition ratio Xn1 of N-side guide layer 104, Xp2<Xn1 (Expression 4). Even more specifically, N-side guide layer 104 is an $In_{0.04}Ga_{0.96}N$ layer and P-side second guide layer 107 is an $In_{0.01}Ga_{0.99}N$ layer. The refractive index of N-side guide layer 104 is thus greater than the refractive index of P-side second guide layer 107. This makes it possible to inhibit the light intensity distribution from moving too far toward P-type cladding layer 110 from active layer 105.

In the present embodiment, barrier layers 105a, 105c, and 105e of active layer 105 include $In_{xb}Ga_{1-xb}N$, and in regard to In composition ratios Xp1 and Xb of each barrier layer and P-side first guide layer 106, Xp1<Xb (Expression 5). This makes it possible to make the refractive index of each barrier layer greater than that of P-side first guide layer 106 and N-side guide layer 104. This in turn makes it possible for the peak of the light intensity distribution in the stacking direction to be located in active layer 105. This also makes it possible to inhibit the light intensity distribution from moving too far toward P-type cladding layer 110 from active layer 105.

In the present embodiment, the average refractive index of P-side first guide layer 106 and P-side second guide layer 107 are smaller than the average refractive index of N-side guide layer 104. This makes it possible to inhibit the light intensity distribution from moving too far toward P-type cladding layer 110 from active layer 105.

In the present embodiment, in regard to thickness Tp1 of P-side first guide layer 106 and thickness Tp2 of P-side second guide layer 107, Tp1<Tp2 (Expression 6). In this way, by making the thickness of P-side first guide layer 106—which has a small band gap energy, i.e., a large refractive index—relatively small, it is possible to inhibit the light intensity distribution from moving too far toward P-type cladding layer 110 from active layer 105. Moreover, by making the thickness of the small In composition ratio P-side first guide layer 106 relatively small, it is possible to avoid disposing P-side first guide layer 106 characterized by a small In composition ratio and large thickness in the vicinity above well layers 105b and 105d, which have the largest In composition ratio in semiconductor stack 100S. The generation of lattice defects can therefore be inhibited.

In the present embodiment, in regard to thickness Tp1 of P-side first guide layer 106 and thickness Tn1 of N-side guide layer 104, Tp1<Tn1 (Expression 7). In this way, by making the thickness of P-side first guide layer 106—which has a small band gap energy, i.e., a large refractive index—smaller than the thickness of N-side guide layer 104, it is possible to inhibit the light intensity distribution from moving too far toward P-type cladding layer 110 from active layer 105.

In the present embodiment, the band gap energy of N-type second cladding layer 103 is smaller than the band gap energy of N-type first cladding layer 102 and larger than the band gap energy of P-side second guide layer 107. Thus, by disposing N-type second cladding layer 103—which has a smaller band gap energy, i.e., a larger refractive index than N-type first cladding layer 102—between N-type first cladding layer 102 and N-side guide layer 104, the light intensity distribution can be inhibited from moving too far toward P-type cladding layer 110 from active layer 105. Moreover, by making the band gap energy of N-type second cladding layer 103 larger than the band gap energy of P-side second guide layer 107, it is possible to inhibit the light intensity distribution from getting to close to N-type second cladding layer 103 from active layer 105.

With the above configuration, according to the present embodiment, position PS1 of the peak of the light intensity distribution in the stacking direction in the portion below ridge 110R can be set to 2.5 nm. In other words, it possible for the peak of the light intensity distribution to be located in active layer 105. Moreover, $\Delta P$ can be inhibited to 6.4 nm. This can increase the optical confinement factor of active layer 105 to about 1.45%.

In this way, with nitride semiconductor light-emitting element 100 according to the present embodiment, it possible for the peak of the light intensity distribution in the stacking direction to be located in active layer 105. Note that the peak of the light intensity distribution in the stacking direction being located in active layer 105 means a state in which the peak of the light intensity distribution in the stacking direction is located in active layer 105 in at least one position in the horizontal direction of nitride semiconductor light-emitting element 100, and is not limited to a state in which the peak of the light intensity distribution in the stacking direction is located in active layer 105 at all positions in the horizontal direction.

Positioning the peak of the light intensity distribution in the stacking direction in active layer 105, as is the case in the present embodiment, increases the portion of the light located in P-type cladding layer 110 compared to when the peak of the light intensity distribution is located in N-side guide layer 104. Here, since P-type cladding layer 110 has a higher impurity concentration than N-type first cladding layer 102 and N-type second cladding layer 103, there is concern about an increase in free carrier loss in P-type cladding layer 110 due to an increase in the proportion of light that is located in P-type cladding layer 110. However, in the present embodiment, by making P-side first guide layer 106 and P-side second guide layer 107 undoped layers, and making the sum of thickness Tp1 of P-side first guide layer 106 and thickness Tp2 of P-side second guide layer 107 relatively large, the proportion of the light intensity distribution that is located in undoped layers can be increased. It is therefore possible to inhibit an increase in free carrier loss. More specifically, in the present embodiment, waveguide loss can be inhibited to about 1.6 cm$^{-1}$.

In nitride semiconductor light-emitting element 100 according to the present embodiment, the effective refractive index difference $\Delta N$ between the portion below ridge 110R and the portions below trenches 110T is set to be relatively small in order to reduce the divergence angle of the emitted light in the horizontal direction (i.e., in the X-axis direction). More specifically, the effective refractive index difference $\Delta N$ is set by adjusting distance dp between current blocking layer 112 and active layer 105 (see FIG. 2A). Here, the larger distance dp is, the smaller the effective refractive index difference $\Delta N$ is. In the present embodiment, the effective refractive index difference $\Delta N$ is approximately $2.4 \times 10^{-3}$. Therefore, in the present embodiment, there are fewer higher-order modes (i.e., higher-order transverse modes) that can propagate in the waveguide formed by ridge 110R compared to when the effective refractive index difference $\Delta N$ is larger than $2.4 \times 10^{-3}$. Therefore, of all transverse modes in the emitted light of nitride semiconductor light-emitting element 100, each higher-order mode accounts for a relatively large proportion. Therefore, the increase or decrease in the number of modes and the amount of change in the optical confinement factor of active layer 105 due to internode coupling is relatively large. Therefore, when the number of modes increases or decreases and internode coupling occurs in nitride semiconductor light-emitting element 100, the linearity of light output characteristics with respect to the supplied current (so-called IL characteristics) decreases. Stated differently, a non-linear portion (also referred to as a "kink") occurs in the graph illustrating IL characteristics. This can result in a decrease in the stability of the light output of nitride semiconductor light-emitting element 100.

Next, the above-mentioned decrease in light output stability will be described. In nitride semiconductor light-emitting element 100, the light intensity distribution in the portion below ridge 110R is dominated by the fundamental mode (i.e., the zeroth-order mode), while the light intensity distribution in the portions below trenches 110T is dominated by higher-order modes. Therefore, when the difference $\Delta P$ between position PS1 of the peak of the light intensity distribution in the stacking direction in the portion below ridge 110R of nitride semiconductor light-emitting element 100 and position PS2 of the peak of the light intensity distribution in the stacking direction in the portion below trench 110T of nitride semiconductor light-emitting element 100 is large, when an increase or decrease in the number of modes and internode coupling occur, the optical confinement factor of active layer 105 fluctuates, reducing the stability of light output.

For example, if the higher-order modes are reduced, the peak of the light intensity distributions in the portions below both ridge 110R and trenches 110T, when added together, moves close to position PS1. Accordingly, the larger the difference $\Delta P$ between positions PS1 and PS2 is, the larger the fluctuation in the optical confinement factor of active layer 105 is when the number of modes changes. This in turn reduces the stability of light output.

In nitride semiconductor light-emitting element 100 according to the present embodiment, since N-side guide layer 104, P-side first guide layer 106, and P-side second guide layer 107 configured as described above are included, in both the portion below ridge 110R and the portions below trenches 110T, the peak of the light intensity distribution can be located in active layer 105. Stated differently, the difference $\Delta P$ between positions PS1 and PS2 of the peaks of the light intensity distributions can be reduced. This inhibits fluctuations in the position in the stacking direction of the peak of the light intensity distributions in the portions below both ridge 110R and trenches 110T, when added together, even if the number of modes increases or decreases and internode coupling occurs. Accordingly, the stability of light output can be improved.

As mentioned above, distance dp is set to a relatively large value in order to set the effective refractive index difference $\Delta N$ to a relatively small value. When the distance dp is set so that the bottom edge of ridge 110R (i.e., the bottom of trench 110T) is below electron barrier layer 109, since electron barrier layer 109 has a large band gap energy, when holes injected from contact layer 111 pass through electron barrier layer 109, the holes can more easily leak from the sidewalls of ridge 110R to the outside of ridge 110R. As a result, holes flow downward below trenches 110T. With this, the radiative recombination rate between electrons and holes injected into active layer 105 below trenches 110T decreases because the light distribution intensity is small in active layer 105, and non-radiative recombination increases. This makes nitride semiconductor light-emitting element 100 more susceptible to degradation. The bottom edge of ridge 110R is therefore set to be above electron barrier layer 109. If distance dc (see FIG. 2A) from the bottom edge of ridge 110R to electron barrier layer 109 becomes too large, holes will flow from ridge 110R to between trenches 110T and electron barrier layer 109, resulting in leakage current.

Distance dc is set to the smallest possible value to inhibit such an increase in leakage current.

1-3. Advantageous Effects

Figure 5:
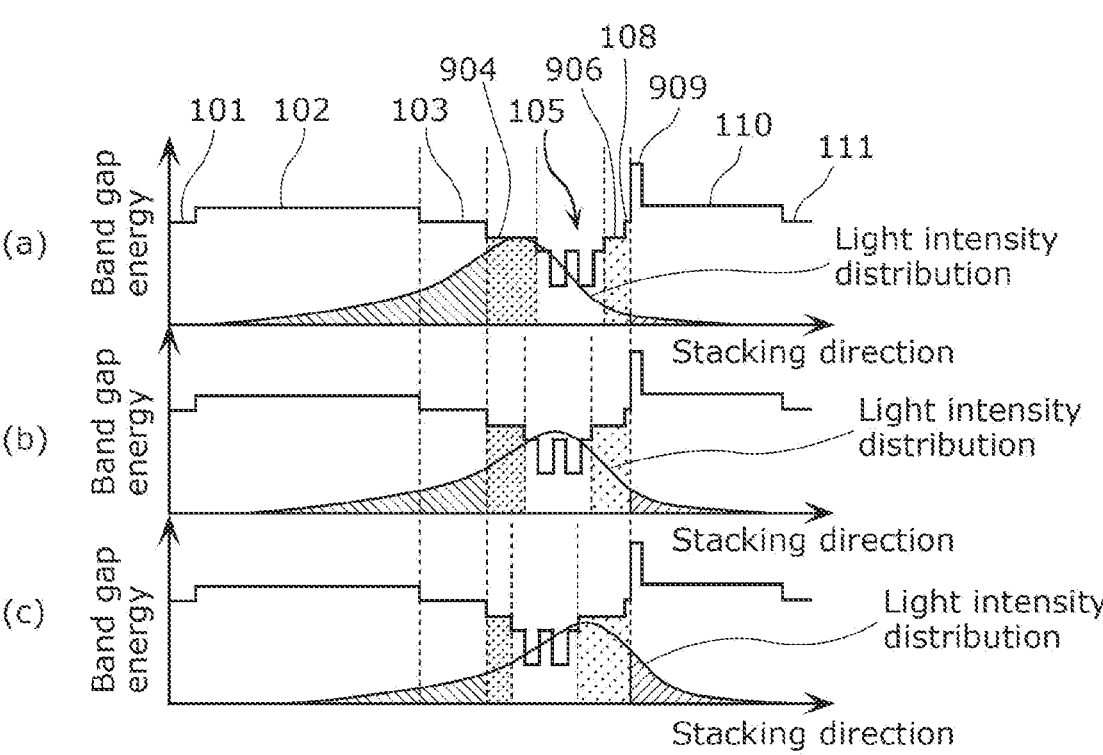
FIG. 5 illustrates schematic graphs of the band gap energy distribution and the light intensity distribution in the stacking direction in the portion below the ridge in nitride semiconductor light-emitting elements according to comparative examples.
Figure 6:
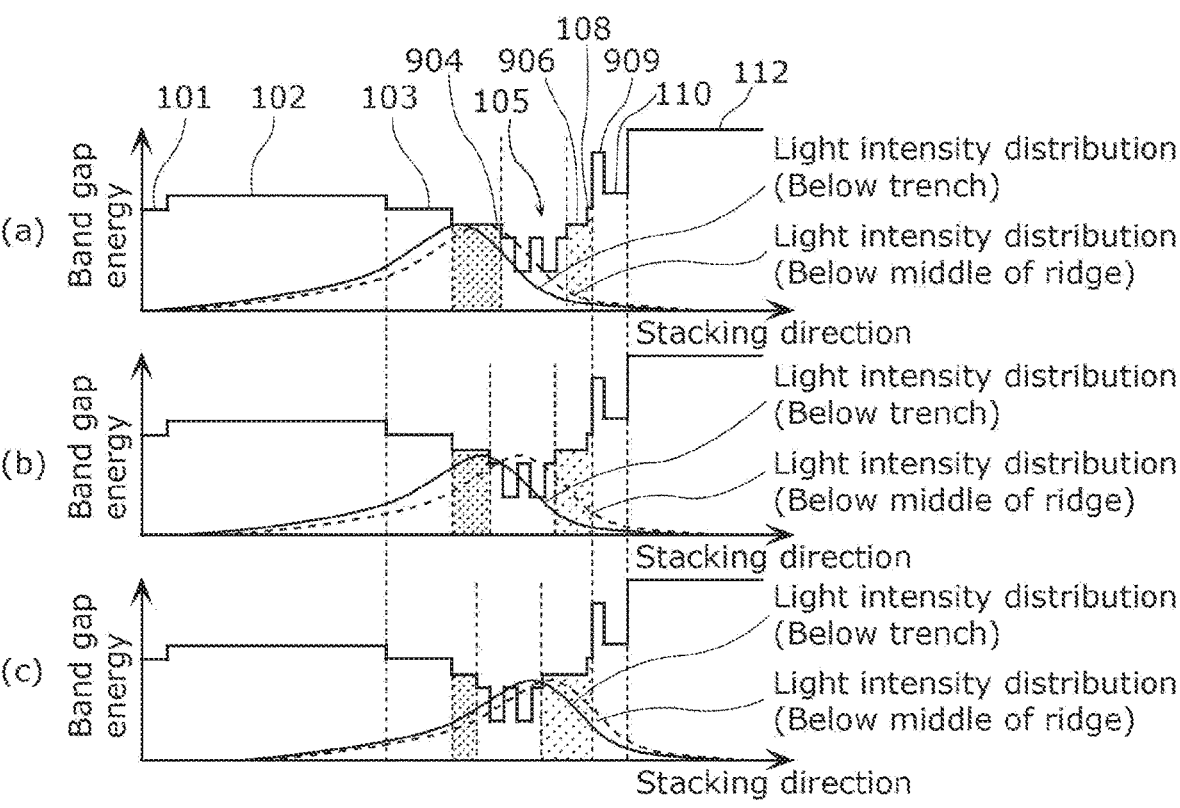
FIG. 6 illustrates schematic graphs of the band gap energy distribution and the light intensity distribution in the stacking direction in the portion below the trench in nitride semiconductor light-emitting elements according to comparative examples.
Figure 11:
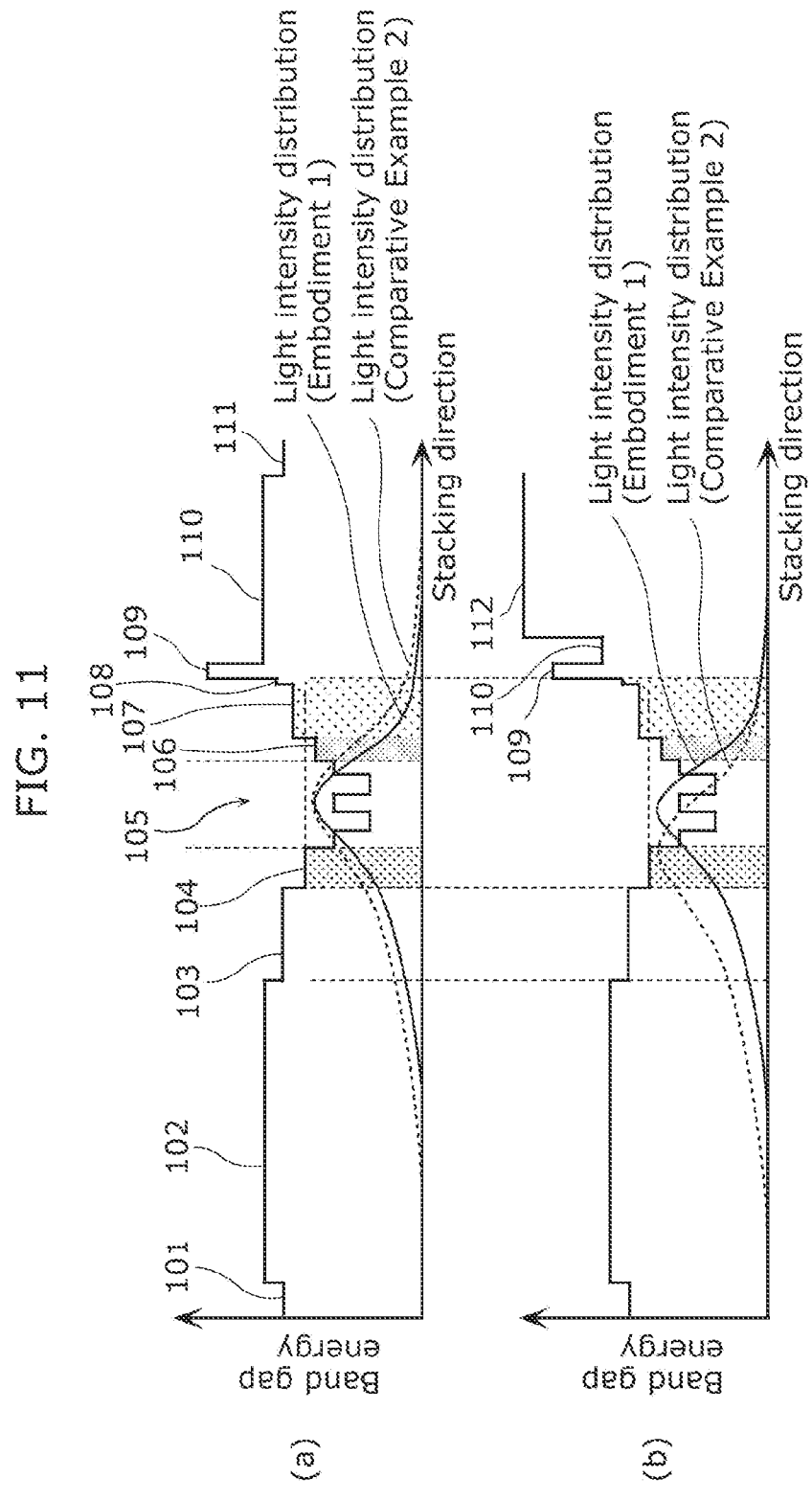
FIG. 11 illustrates schematic graphs of the band gap energy distribution and the light intensity distribution in the stacking direction of the nitride semiconductor light-emitting element according to Embodiment 1.
Figure 12:
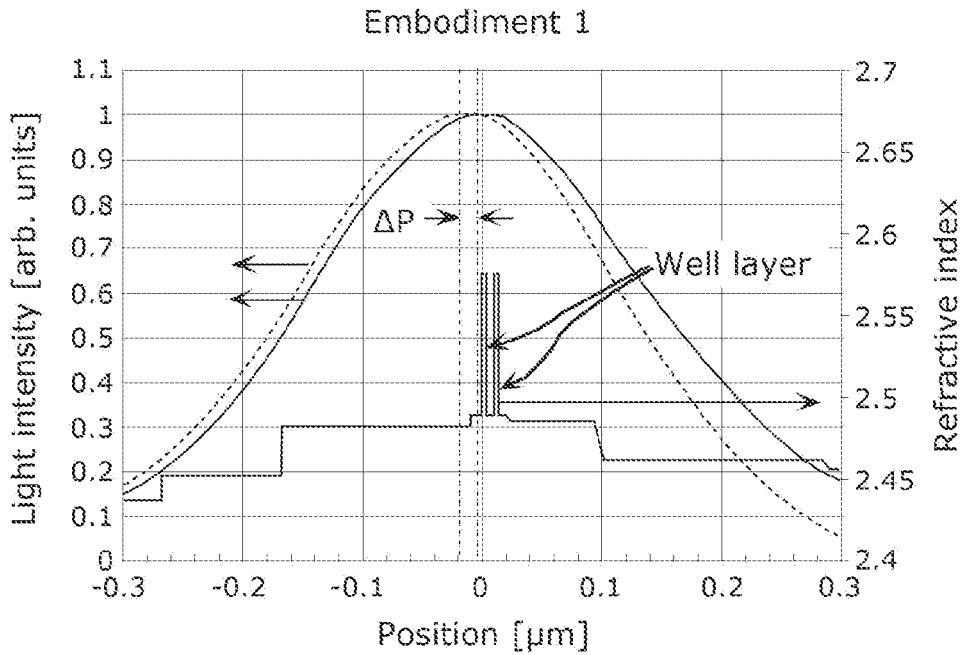
FIG. 12 is a graph illustrating a simulation result of the light intensity distribution and the refractive index distribution in the nitride semiconductor light-emitting element according to Embodiment 1.

Next, the advantageous effects of nitride semiconductor light-emitting element 100 according to the present embodiment described above will be described with reference to FIG. 5 through FIG. 12, in comparison with a comparative example nitride semiconductor light-emitting elements. FIG. 5 illustrates schematic graphs of the band gap energy distribution and the light intensity distribution in the stacking direction in the portion below ridge 110R of nitride semiconductor light-emitting elements according to comparative examples, and FIG. 6 illustrates schematic graphs of the band gap energy distribution and the light intensity distribution in the stacking direction in the portion below trench 110T of nitride semiconductor light-emitting elements according to comparative examples. Graphs (a) through (c) in FIG. 5 show the band gap energy distribution and the light intensity distribution in the portion below ridge 110R of nitride semiconductor light-emitting elements according to Comparative Examples 1 through 3, respectively. Graphs (a) through (c) in FIG. 6 show the band gap energy distribution and the light intensity distribution in the portion below trench 110T of nitride semiconductor light-emitting elements according to Comparative Examples 1 through 3, respectively. FIG. 7 through FIG. 10 are graphs illustrating simulation results of the light intensity distribution and the refractive index distribution in the portion below ridge 110R of nitride semiconductor light-emitting elements according to Comparative Examples 1 through 4, respectively. FIG. 11 illustrates schematic graphs of the band gap energy distribution and the light intensity distribution in the stacking direction of nitride semiconductor light-emitting element 100 according to the present embodiment. Graphs (a) and (b) in FIG. 11 show the band gap energy distribution and the light intensity distribution in the portion below ridge 110R ((a) in FIG. 11) and the portion below trench 110T ((b) in FIG. 11) of nitride semiconductor light-emitting element 100. FIG. 12 is a graph illustrating a simulation result of the light intensity distribution and the refractive index distribution in nitride semiconductor light-emitting element 100 according to the present embodiment.

In FIG. 5, FIG. 6, and FIG. 11, the horizontal axis indicates stacking direction and the vertical axis indicates band gap energy and light intensity. In FIG. 7 through FIG. 10 and FIG. 12, the horizontal axis indicates position in the stacking direction, and the left and right vertical axes indicate light intensity and refractive index, respectively. In addition, in FIG. 7 through FIG. 10 and FIG. 12, the light intensity distribution in the stacking direction in the portions below trenches 110T is shown with dotted lines.

The nitride semiconductor light-emitting elements according to Comparative Examples 1 through 3 illustrated in FIG. 5 through FIG. 9 differ from nitride semiconductor light-emitting element 100 according to the present embodiment in regard to the configuration of the N-side guide layer and P-side guide layer. The nitride semiconductor light-emitting elements according to Comparative Examples 1 through 3 include a single N-side guide layer 904 and a single P-side guide layer 906. N-side guide layer 904 and P-side guide layer 906 have the same band gap energy.

In the nitride semiconductor light-emitting element according to Comparative Example 1, thickness Tn0 of N-side guide layer 904 is larger than thickness Tp0 of P-side guide layer 906. More specifically, N-side guide layer 904 is an $In_{0.03}Ga_{0.97}N$ layer with a thickness of 340 nm, and P-side guide layer 906 is an $In_{0.03}Ga_{0.97}N$ layer with a thickness of 100 nm. In the nitride semiconductor light-emitting element according to Comparative Example 2, thickness Tn0 of N-side guide layer 904 is equal to thickness Tp0 of P-side guide layer 906. More specifically, N-side guide layer 904 and P-side guide layer 906 are $In_{0.03}Ga_{0.97}N$ layers with a thickness of 220 nm. In the nitride semiconductor light-emitting element according to Comparative Example 3, thickness Tn0 of N-side guide layer 904 is smaller than thickness Tp0 of P-side guide layer 906. More specifically, N-side guide layer 904 is an $In_{0.03}Ga_{0.97}N$ layer with a thickness of 100 nm, and P-side guide layer 906 is an $In_{0.03}Ga_{0.97}N$ layer with a thickness of 340 nm.

Figure 10:
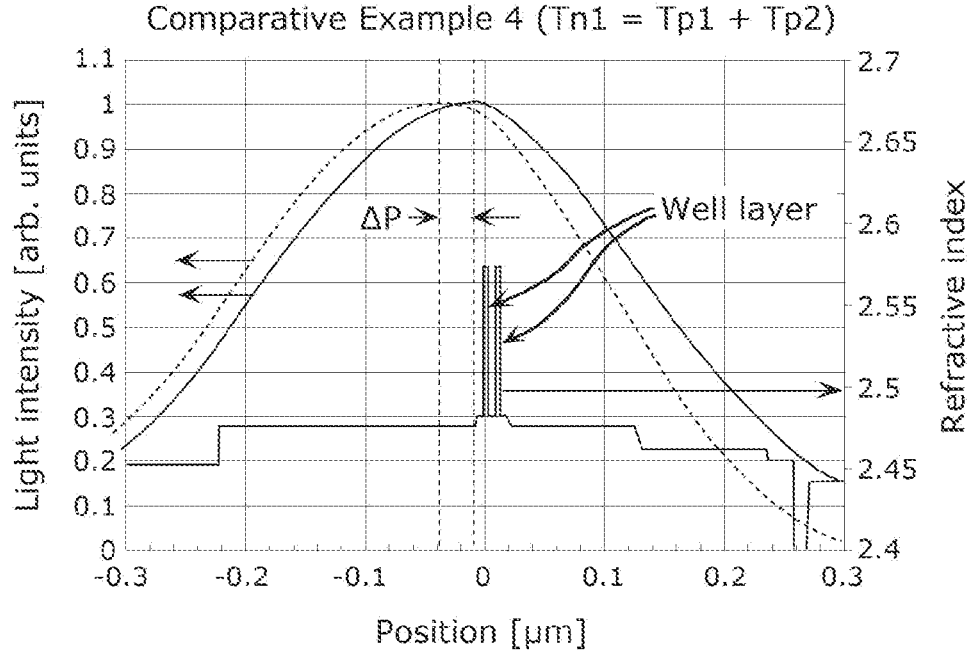
FIG. 10 is a graph illustrating a simulation result of the light intensity distribution and the refractive index distribution in the portion below the ridge in a nitride semiconductor light-emitting element according to Comparative Example 4.

The nitride semiconductor light-emitting elements according to Comparative Example 4 illustrated in FIG. 10 differs from nitride semiconductor light-emitting element 100 according to the present embodiment in regard to the configuration of the N-side guide layer and P-side guide layer. The nitride semiconductor light-emitting element according to Comparative Example 4 includes an N-side guide layer, a P-side first guide layer, and a P-side second guide layer, just like nitride semiconductor light-emitting element 100 according to the present embodiment. In the nitride semiconductor light-emitting element according to Comparative Example 4, the band gap energy of the P-side second guide layer is larger than the band gap energy of the N-side first guide layer, the band gap energy of the N-side first guide layer is equal to the band gap energy of the P-side first guide layer, and in regard to thickness Tp1 of the P-side first guide layer, thickness Tp2 of the P-side second guide layer, and thickness Tn1 of the N-side first guide layer, Tn1=Tp1+Tp2 (Expression 8) and Tp1=Tp2 (Expression 9). More specifically, the N-side guide layer is an $In_{0.03}Ga_{0.97}N$ layer with a thickness of 220 nm, the P-side first guide layer is an $In_{0.03}Ga_{0.97}N$ layer with a thickness of 110 nm, and the P-side second guide layer is an $In_{0.01}Ga_{0.99}N$ layer with a thickness of 110 nm.

In the simulation, the Al composition ratio of electron barrier layer 909 in Comparative Examples 1 through 4 and electron barrier layer 109 according to the present embodiment is assumed to be uniform. Stated differently, the Al composition ratio of each electron barrier layer is not graded in the stacking direction.

The element structure used in the simulation of each nitride semiconductor light-emitting element according to Comparative Examples 1 through 4 and the present embodiment described above is shown in Table 1 below, and the values obtained from the simulation are shown in Table 2 below.

TABLE 1

| Layer name | Composition | Impurity | Impurity concentration [cm$^{-3}$] | Comparative Ex. 1 Thickness [nm] | Comparative Ex. 2 Thickness [nm] | Comparative Ex. 3 Thickness [nm] | Comparative Ex. 4 Thickness [nm] | Embodiment 1 Thickness [nm] |
|---|---|---|---|---|---|---|---|---|
| | Common Between Comparative Examples 1-4 & Embodiment 1 | | | | | | | |
| N-type first cladding layer | Al$_{0.035}$Ga$_{0.965}$N | Si | $1 \times 10^{18}$ | 1200 | 1200 | 1200 | 1200 | 1200 |
| N-type second cladding layer | GaN | Si | $1 \times 10^{18}$ | 100 | 100 | 100 | 100 | 100 |
| N-side guide layer | In$_{0.03}$Ga$_{0.97}$N | — | — | 340 | 220 | 100 | 220 | 150 |
| Barrier layer | In$_{0.04}$Ga$_{0.96}$N | — | — | 6 | 6 | 6 | 6 | 6 |
| Well layer | In$_{0.18}$Ga$_{0.82}$N | — | — | 3 | 3 | 3 | 3 | 3 |
| Barrier layer | In$_{0.04}$Ga$_{0.96}$N | — | — | 7 | 7 | 7 | 7 | 7 |
| Well layer | In$_{0.18}$Ga$_{0.82}$N | — | — | 3 | 3 | 3 | 3 | 3 |
| Barrier layer | In$_{0.04}$Ga$_{0.96}$N | — | — | 6 | 6 | 6 | 6 | 6 |
| P-side (first) guide layer | In$_{0.03}$Ga$_{0.97}$N | — | — | 100 | 220 | 340 | 110 | 100 |
| P-side second guide layer | In$_{0.01}$Ga$_{0.99}$N | — | — | — | — | — | 110 | 190 |
| Intermediate layer | GaN | — | — | 20 | 20 | 20 | 20 | 20 |
| Electron barrier layer | Al$_{0.36}$Ga$_{0.64}$N | Mg | $1 \times 10^{19}$ | 5 | 5 | 5 | 5 | 5 |
| P-type cladding layer | Al$_{0.035}$Ga$_{0.965}$N | Mg | $2 \times 10^{18}$ / $1 \times 10^{19}$ | 150 / 300 | 150 / 300 | 150 / 300 | 150 / 300 | 150 / 300 |
| Contact layer | GaN | Mg | $1 \times 10^{20}$ | 100 | 100 | 100 | 100 | 100 |

TABLE 2

| | Comparative Ex. 1 | Comparative Ex. 2 | Comparative Ex. 3 | Comparative Ex. 4 | Embodiment 1 |
|---|---|---|---|---|---|
| Distance dc | 80 | 70 | 70 | 53 | 40 |
| Optical confinement factor [%] | 1.03 | 1.31 | 1.11 | 1.32 | 1.35 |
| Waveguide loss [cm$^{-1}$] | 2.56 | 2.32 | 2.26 | 2.1 | 2.1 |
| Effective refractive index difference ΔN [10$^{-3}$] | 2.7 | 2.8 | 2.6 | 2.8 | 2.7 |
| Position PS1 [nm] | −84.3 | 1.4 | 72.6 | −10.4 | 9.5 |
| Difference ΔP [nm] between position PS1 and peak position PS2 in waveguideable limit mode | 53.7 | 24.1 | 26.1 | 24.9 | 8.8 |

Table 2 shows distance dc from the bottom edge of ridge 110R to electron barrier layer 109, the optical confinement factor, the waveguide loss, the effective refractive index difference ΔN, peak position PS1 of the light intensity distribution in the stacking direction at the horizontal center of the portion below ridge 110R, and the absolute value of difference ΔP between peak position PS1 and peak position PS2 in the stacking direction of the waveguideable limit mode. Distance dc is set to a distance that allows the effective refractive index difference to be less than or equal to $2.8 \times 10^{-3}$. The waveguideable limit mode means the highest-order mode that can propagate in each nitride semiconductor light-emitting element. The peak position in the stacking direction of the waveguideable limit mode is a numerical value corresponding to the peak position of the light intensity distribution in the portion below trench 110T where the higher-order modes are dominant.

Figure 7:
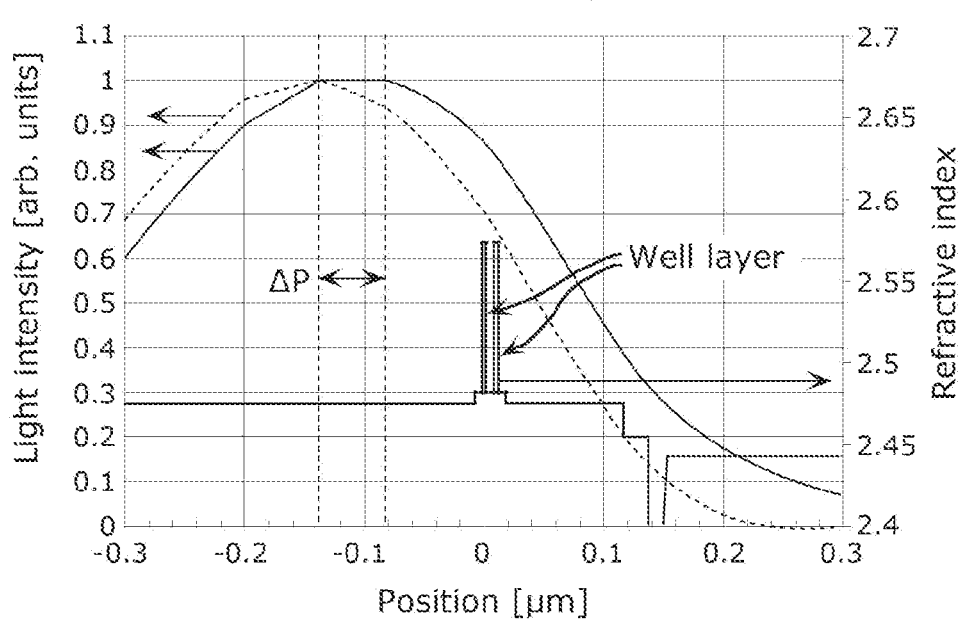
FIG. 7 is a graph illustrating a simulation result of the light intensity distribution and the refractive index distribution in the portion below the ridge in a nitride semiconductor light-emitting element according to Comparative Example 1.

In the nitride semiconductor light-emitting element according to Comparative Example 1, the peak of the light intensity distribution is located in N-side guide layer 904 because the thickness of N-side guide layer 904 is larger than the thickness of P-side guide layer 906, as illustrated in graphs (a) in FIG. 5 and FIG. 6, as well as in FIG. 7. Therefore, the optical confinement factor of active layer 105 is low and the thermal saturation level of the light output is low. Distance dp between the bottom edge of ridge 110R and active layer 105 is smaller because the thickness of P-side guide layer 906 is smaller. The effective refractive index difference ΔN therefore increases, resulting in a larger divergence angle of the emitted light in the horizontal direction. In order to reduce the effective refractive index difference ΔN, distance dc from electron barrier layer 909 to the bottom edge of ridge 110R must be relatively large, 80 nm. This increases the leakage current mentioned above and increases the oscillation threshold current of the nitride semiconductor light-emitting element.

In the nitride semiconductor light-emitting element according to Comparative Example 1, because the thickness of P-side guide layer 906 is relatively small, the effect of current blocking layer 112 disposed in trenches 110T on the light intensity distribution is relatively large. Therefore, the difference ΔP between the peak position of the light intensity distribution in the stacking direction in the portion below ridge 110R and the peak position of the light intensity distribution in the stacking direction in the portions below trenches 110T is relatively large (see FIG. 7 in particular). The linearity of the IL characteristics of the nitride semiconductor light-emitting element according to Comparative Example 1 is therefore low.

Figure 8:
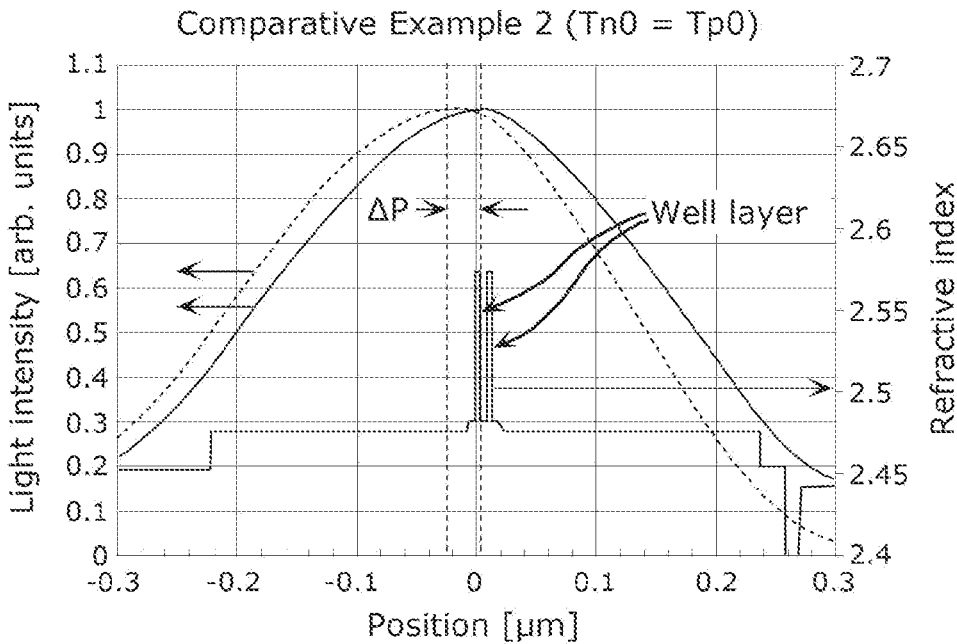
FIG. 8 is a graph illustrating a simulation result of the light intensity distribution and the refractive index distribution in the portion below the ridge in a nitride semiconductor light-emitting element according to Comparative Example 2.

In the nitride semiconductor light-emitting element according to Comparative Example 2, in the portion below ridge 110R, the peak of the light intensity distribution is located in active layer 105 because the thickness of N-side guide layer 904 is equal to the thickness of P-side guide layer 906, as illustrated in graphs (b) in FIG. 5 and FIG. 6, as well as in FIG. 8. Therefore, in the portion below ridge 110R, the high optical confinement factor of active layer 105 is high. However, in the nitride semiconductor light-emitting element according to Comparative Example 2, because the thickness of P-side guide layer 906 is not large, current blocking layer 112 disposed in trenches 110T has an effect on the light intensity distribution. Since the peak of the light intensity distribution in the stacking direction in the portion below trench 110T is located in N-side guide layer 904, the optical confinement factor is low in the portion below trench 110T. The difference $\Delta P$ between the peak position of the light intensity distribution in the stacking direction in the portion below ridge 110R and the peak position of the light intensity distribution in the stacking direction in the portions below trenches 110T is relatively large. The linearity of the IL characteristics of the nitride semiconductor light-emitting element according to Comparative Example 2 is therefore low.

Figure 9:
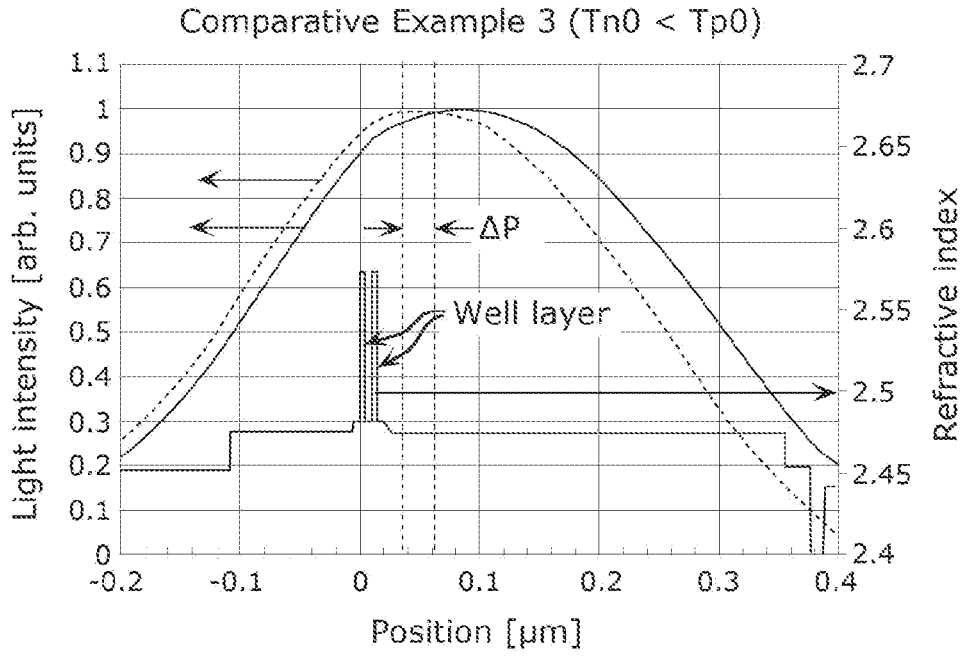
FIG. 9 is a graph illustrating a simulation result of the light intensity distribution and the refractive index distribution in the portion below the ridge in a nitride semiconductor light-emitting element according to Comparative Example 3.

In the nitride semiconductor light-emitting element according to Comparative Example 3, the peak of the light intensity distribution is located in P-side guide layer 906 because the thickness of N-side guide layer 904 is smaller than the thickness of P-side guide layer 906, as illustrated in graphs (c) in FIG. 5 and FIG. 6, as well as in FIG. 9. Therefore, the optical confinement factor of active layer 105 is low and the thermal saturation level of the light output is low.

In the nitride semiconductor light-emitting element according to Comparative Example 3, because the peak of the light intensity distribution is located in P-side guide layer 906, the effect of current blocking layer 112 on the light intensity distribution is relatively large. Therefore, the difference $\Delta P$ between the peak position of the light intensity distribution in the stacking direction in the portion below ridge 110R and the peak position of the light intensity distribution in the stacking direction in the portions below trenches 110T is relatively large (see FIG. 9 in particular). Accordingly, the linearity of the IL characteristics of the nitride semiconductor light-emitting element according to Comparative Example 3 is low.

In the nitride semiconductor light-emitting element according to Comparative Example 4, because the thickness of the P-side second guide layer is small compared to nitride semiconductor light-emitting element 100 according to the present embodiment, the effect of current blocking layer 112 on the light intensity distribution is relatively large, as illustrated in FIG. 10. Accordingly, the difference $\Delta P$ between the peak position of the light intensity distribution in the stacking direction in the portion below ridge 110R and the peak position of the light intensity distribution in the stacking direction in the portions below trenches 110T is relatively large. Accordingly, the linearity of the IL characteristics of the nitride semiconductor light-emitting element according to Comparative Example 4 is low.

In contrast to the above comparative examples, in nitride semiconductor light-emitting element 100 according to the present embodiment, since the sum of thickness Tp1 of P-side first guide layer 106 and thickness Tp2 of P-side second guide layer 107 is larger than thickness Tn1 of N-side guide layer 104, the effective refractive index difference $\Delta N$ can be reduced. The divergence angle of the emitted light in the horizontal direction can therefore be reduced. Distance dc from the bottom edge of ridge 110R to electron barrier layer 109 can be set to 40 nm, which is significantly smaller than distance dc in each of the comparative examples. Therefore, the leakage current between the bottom edge of ridge 110R and electron barrier layer 109 can be inhibited, reducing the oscillation threshold current.

In the present embodiment, the peak of the light intensity distribution in the stacking direction can be located in active layer 105 in both the portion below ridge 110R and the portions below trenches 110T, as illustrated in FIG. 11 and FIG. 12. Therefore, the optical confinement factor can be increased compared to each of the comparative examples. In addition, the linearity of the IL characteristics can be improved because the difference $\Delta P$ in peak positions can be reduced.

In nitride semiconductor light-emitting element 100 according to the present embodiment, since the peak of the light intensity distribution in the stacking direction is located in active layer 105, the light intensity in P-type cladding layer 110 is larger than when the peak of the light intensity distribution is located in the N-side guide layer as in, for example, Comparative Example 1. Therefore, there is concern that free carrier loss in P-type cladding layer 110, which has a higher impurity concentration than N-type first cladding layer 102 and N-type second cladding layer 103, will increase. However, in the present embodiment, by making P-side first guide layer 106 and P-side second guide layer 107 undoped layers, and making the sum of thickness Tp1 of P-side first guide layer 106 and thickness Tp2 of P-side second guide layer 107 relatively large, the proportion of the light intensity distribution that is located in undoped layers can be increased. It is therefore possible to inhibit an increase in free carrier loss. In the present embodiment, since the impurity concentration at the edge of P-type cladding layer 110 on the side near active layer 105 is lower than the impurity concentration at the edge of P-type cladding layer 110 on the side far from active layer 105, free carrier loss at the edge of P-type cladding layer 110 on the side near active layer 105, where light intensity is relatively high, can be inhibited.

Figure 13:
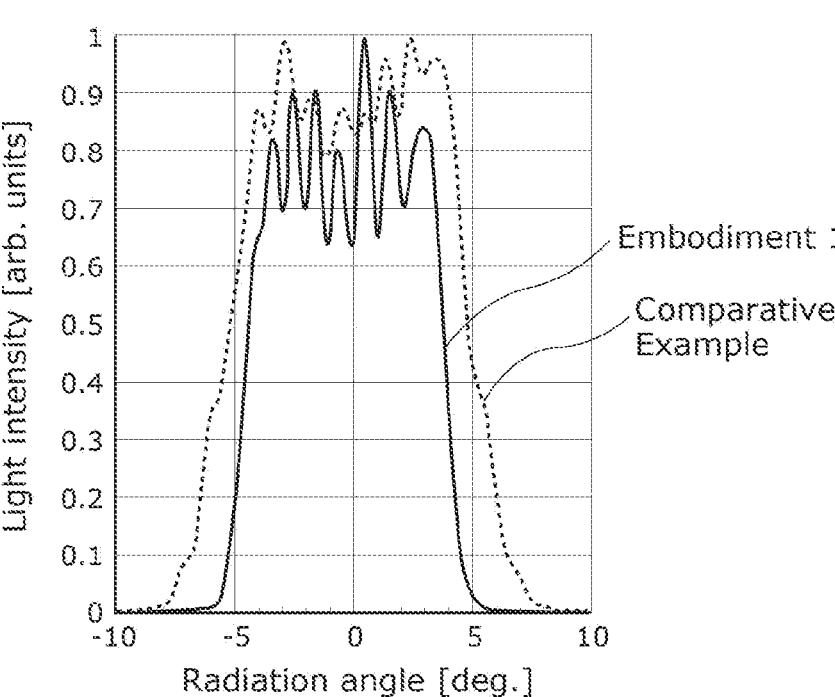
FIG. 13 is a graph illustrating a simulation result of the relationship between radiation angle and light intensity for the nitride semiconductor light-emitting element according to Embodiment 1.
Figure 14:
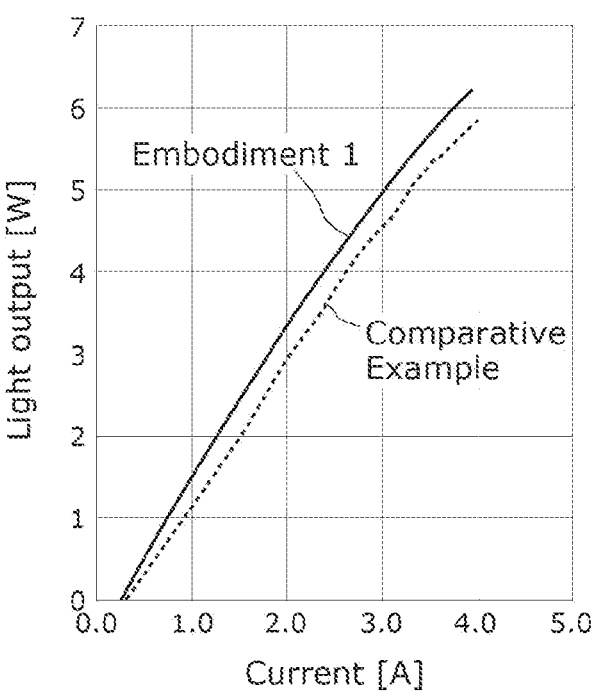
FIG. 14 is a graph illustrating a simulation result of the IL characteristics for the nitride semiconductor light-emitting element according to Embodiment 1.

Here, the output characteristics of nitride semiconductor light-emitting element 100 according to the present embodiment will be described with reference to FIG. 13 and FIG. 14. FIG. 13 is a graph illustrating a simulation result of the relationship between radiation angle and light intensity for nitride semiconductor light-emitting element 100 according to the present embodiment. FIG. 13 also illustrates, as a comparative example, the relationship between radiation angle and light intensity for a nitride semiconductor light-emitting element according to a comparative example with an effective refractive index difference $\Delta N$ of $7 \times 10^{-3}$. FIG. 14 is a graph illustrating a simulation result of the IL characteristics for nitride semiconductor light-emitting element 100 according to the present embodiment. FIG. 14 also illustrates the IL characteristics for the nitride semiconductor light-emitting element according to Comparative Example 2.

As illustrated in FIG. 13, in nitride semiconductor light-emitting element 100 according to the present embodiment, since the effective refractive index difference $\Delta N$ is less than $2.8 \times 10^{-3}$, the beam divergence angle in the horizontal direction can be reduced more so than the nitride semiconductor light-emitting element according to the comparative example. In the example illustrated in FIG. 13, the total beam width, which is $1/e^2$ of the peak intensity, can be reduced to approximately 9.3°.

As illustrated in FIG. 14, nitride semiconductor light-emitting element 100 according to the present embodiment produces more linear IL characteristics than the nitride semiconductor light-emitting element according to the comparative example. Moreover, a higher slope efficiency (about 1.9 W/A) than in the comparative example can be obtained.

Figure 15:
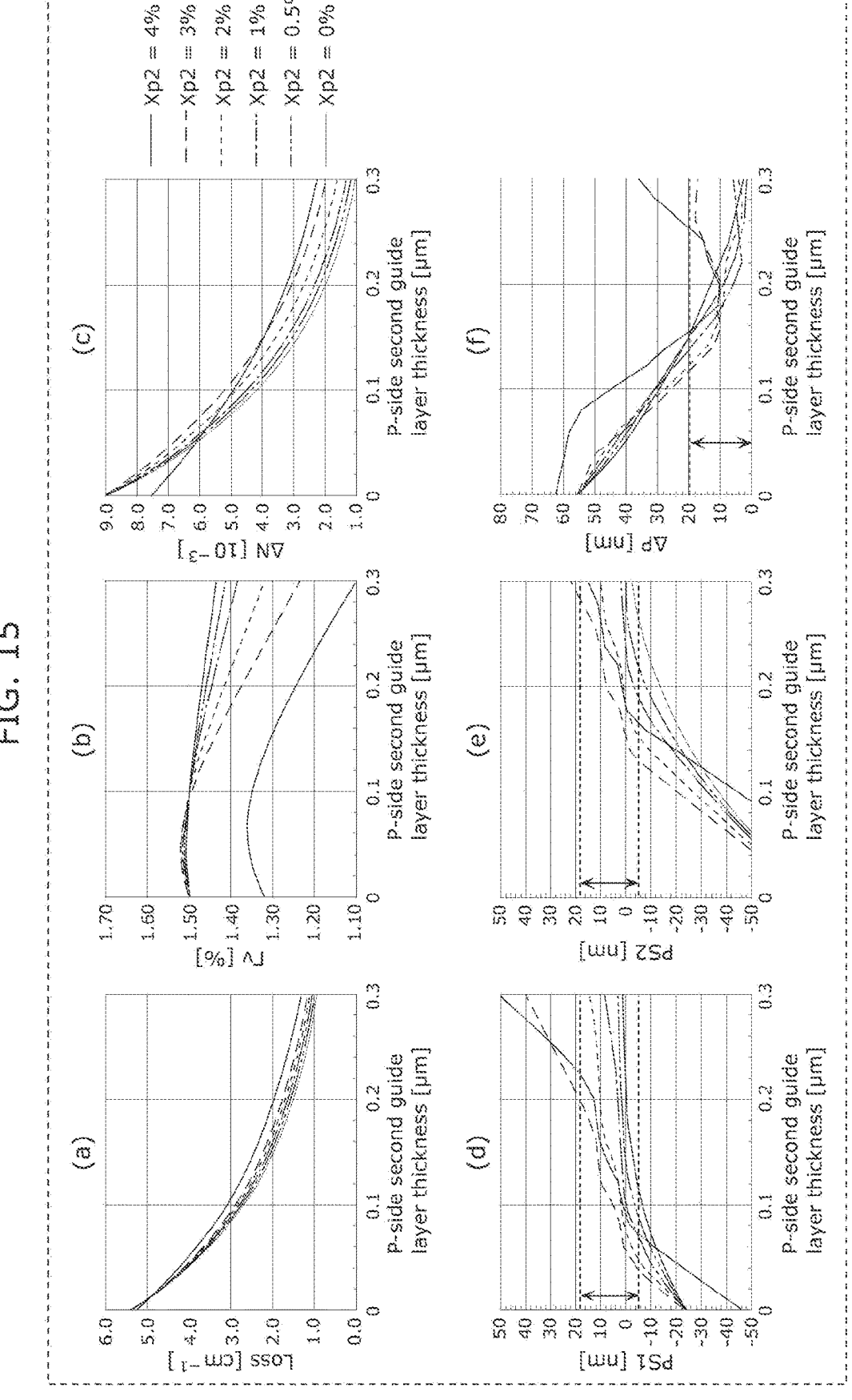
FIG. 15 illustrates graphs of simulation results of the relationship between (i) the In composition ratio and the thickness of a P-side second guide layer and (ii) each parameter when the In composition ratio of each barrier layer in the nitride semiconductor light-emitting element according to Embodiment 1 is 4%.
Figure 16:
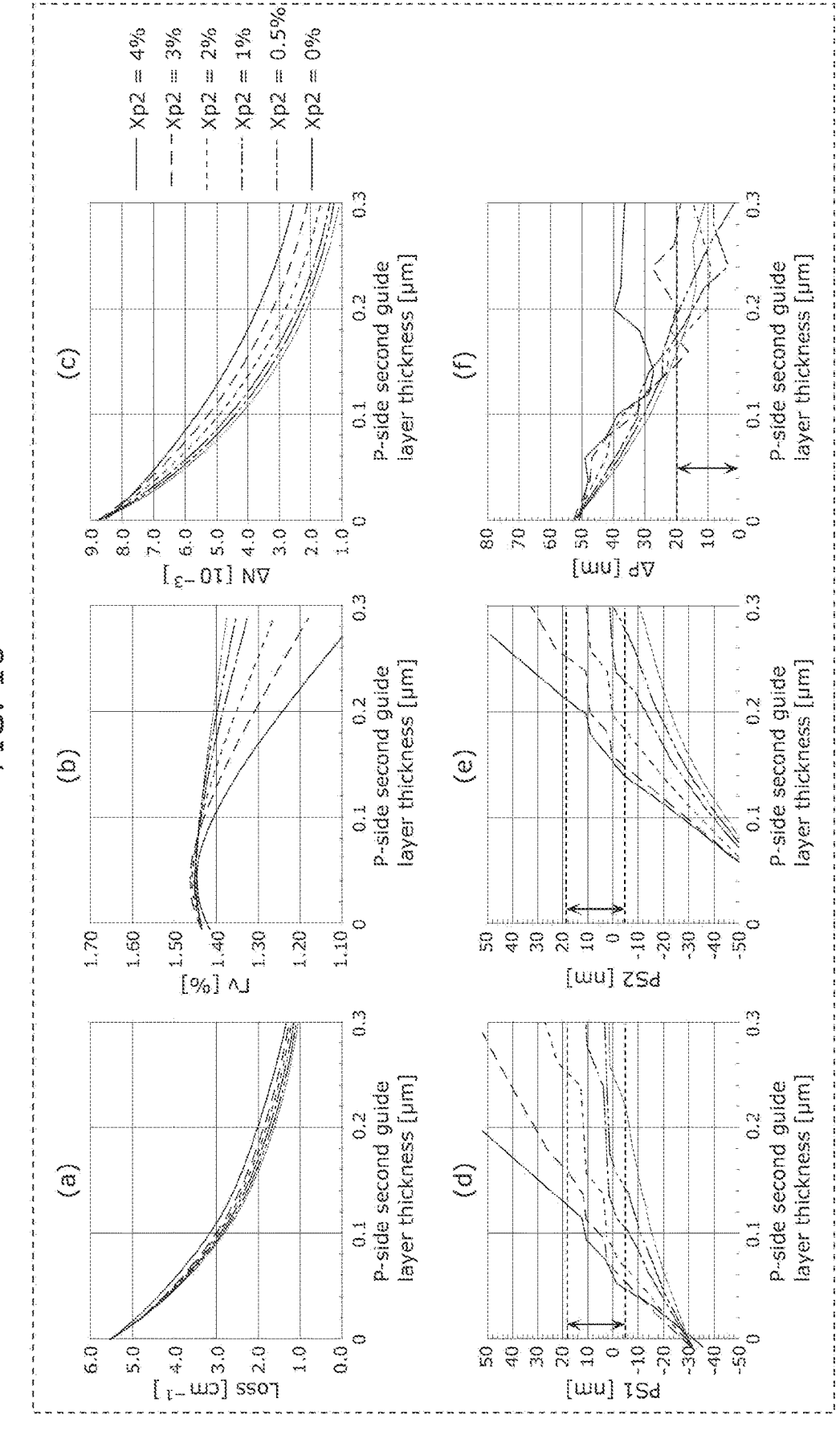
FIG. 16 illustrates graphs of simulation results of the relationship between (i) the In composition ratio and the thickness of the P-side second guide layer and (ii) each parameter when the In composition ratio of each barrier layer in the nitride semiconductor light-emitting element according to Embodiment 1 is 0%.

Next, the relationship between the configuration of P-side second guide layer 107 according to the present embodiment and the advantageous effects will be described in detail with reference to FIG. and FIG. 16. FIG. 15 illustrates graphs of simulation results of the relationship between (i) In composition ratio Xp2 and thickness Tp2 of P-side second guide layer 107 and (ii) each parameter when the In composition ratio of each barrier layer in nitride semiconductor light-emitting element 100 according to the present embodiment is 4%. FIG. 16 illustrates graphs of simulation results of the relationship between (i) In composition ratio Xp2 and thickness Tp2 of P-side second guide layer 107 and (ii) each parameter when the In composition ratio of each barrier layer in nitride semiconductor light-emitting element 100 according to the present embodiment is 0%. Graphs (a) through (f) in FIG. 15 and FIG. 16 show the relationship between thickness Tp2 of the P-side second guide layer and waveguide loss, optical confinement factor $\lceil$v, effective refractive index difference $\Delta$N ($\times 10^{-3}$), position PS1, position PS2, and $\Delta$P, respectively. In each graph, In composition ratio Xp2 of P-side second guide layer 107 is shown for 0%, 0.5%, 1%, 2%, 3%, and 4%. In the simulation, In composition ratio Xn1 of N-side guide layer 104 is 4% and the thickness is 160 nm. In composition ratio Xp1 of P-side first guide layer 106 is 4.5%, and the thickness is 80 nm.

As illustrated in graphs (a) in FIG. 15 and FIG. 16, the waveguide loss decreases as thickness Tp2 of P-side second guide layer 107 increases for all In composition ratios Xp2. The waveguide loss also decreases as In composition ratio Xp2 decreases.

As illustrated in graphs (b) in FIG. 15 and FIG. 16, for all In composition ratios Xp2, optical confinement factor $\lceil$v is maximum within thickness Tp2 of P-side second guide layer 107 from zero to approximately 100 nm, and as thickness Tp2 increases beyond 100 nm, optical confinement factor $\lceil$y decreases. When thickness Tp2 is 100 nm or greater, optical confinement factor $\lceil$v increases as In composition ratio Xp2 decreases.

As illustrated in graphs (c) in FIG. 15 and FIG. 16, effective refractive index difference $\Delta$N decreases as thickness Tp2 of P-side second guide layer 107 increases for all In composition ratios Xp2. Effective refractive index difference $\Delta$N tends to generally decrease as In composition ratio Xp2 decreases.

As illustrated in graphs (d) and (e) in FIG. 15 and FIG. 16, for all In composition ratios Xp2, positions PS1 and PS2 increase as thickness Tp2 of P-side second guide layer 107 increases. Positions PS1 and PS2 tend to generally decrease as In composition ratio Xp2 decreases. Graphs (d) and (e) in FIG. 15 and FIG. 16 show a range where positions PS1 and PS2 are between −5 nm and 18 nm, inclusive, as one example of the range of positions PS1 and PS2 where the optical confinement factor is improved. Of this range, when positions PS1 and PS2 are between 0 nm and 13 nm, inclusive, this corresponds to being located in any one of well layer 105b, barrier layer 105c, and well layer 105d in active layer 105. When positions PS1 and PS2 are greater than or equal to −5 nm and less than 0 nm, this corresponds to being located within a distance of 5 nm toward N-type second cladding layer 103 from well layer 105b of active layer 105 that is closest to N-type second cladding layer 103. When positions PS1 and PS2 are greater than 13 nm and less than or equal to 18 nm, this corresponds to being located within a distance of 5 nm toward P-type cladding layer 110 from well layer 105d of active layer 105 that is closest to P-type cladding layer 110. Therefore, optical confinement factor $\lceil$v can be increased by locating the peak of the light intensity distribution at such a position between −5 nm and 18 nm, inclusive.

As illustrated in graphs (f) in FIG. 15 and FIG. 16, except when In composition ratio Xp1 of P-side first guide layer 106 is equal to the In composition ratio of P-side second guide layer 107 (i.e., different from the present embodiment), $\Delta$P tends to generally decrease as thickness Tp2 of P-side second guide layer 107 increases. Graphs (f) in FIG. 15 and FIG. 16 illustrate a range where $\Delta$P is between 0 nm and 20 nm, inclusive, as one example of a range of $\Delta$P where the linearity of the IL characteristics can be improved.

From the graphs in FIG. 15 and FIG. 16, by setting thickness Tp2 of P-side second guide layer 107 to 100 nm or more, the reduction of waveguide loss, the increase of optical confinement factor $\lceil$v, and the reduction of effective refractive index difference $\Delta$N can be achieved simultaneously. Thickness Tp2 may be 250 nm or less to further increase optical confinement factor $\lceil$v. In composition ratio Xp2 of P-side second guide layer 107 may be 0.5% or more to place positions PS1 and PS2 near well layers 105b and 105d of active layer 105.

Figure 17:
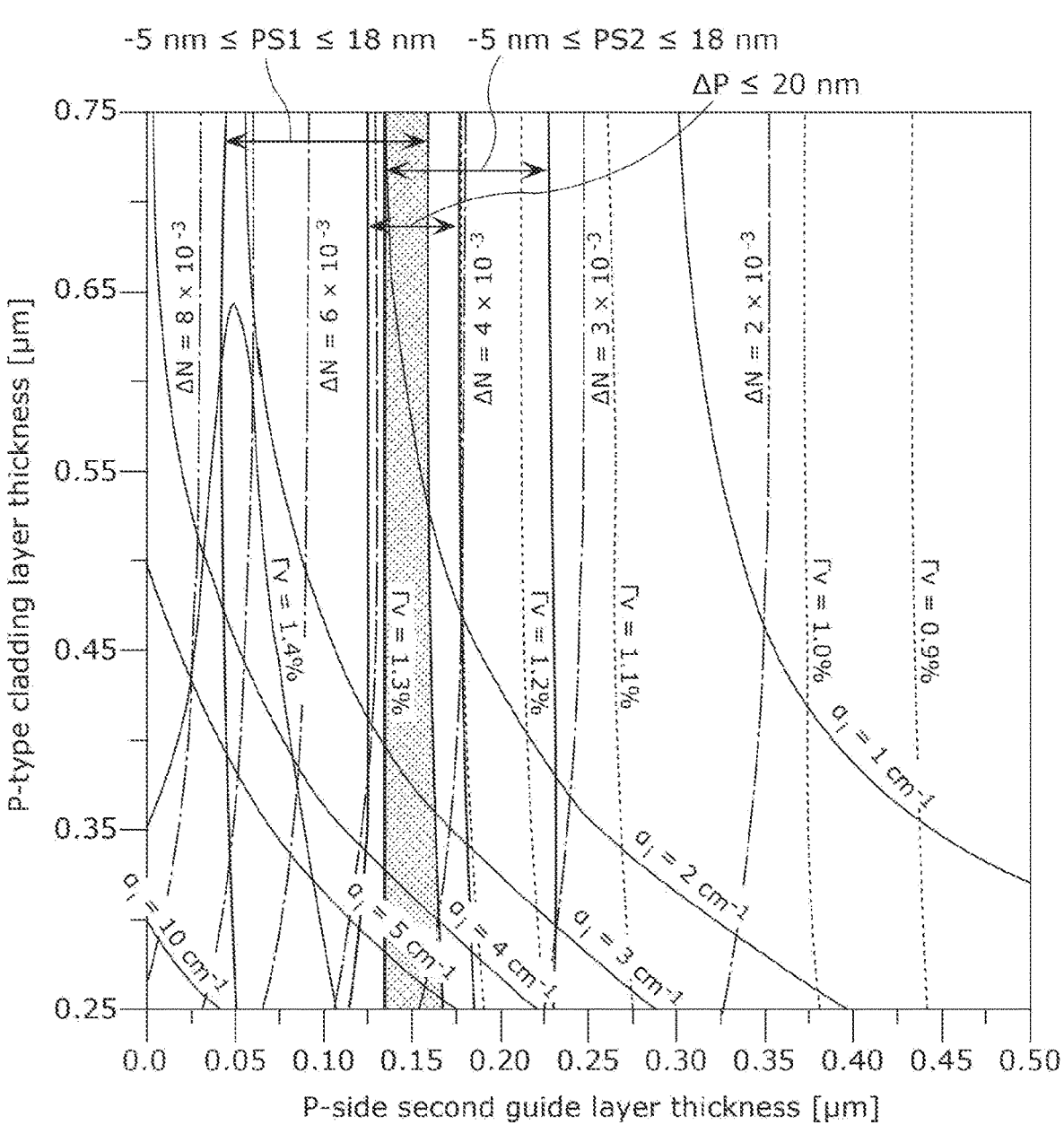
FIG. 17 is a graph illustrating the relationship between the thickness of a P-side second guide layer, the thickness of a P-type cladding layer, and each parameter of a nitride semiconductor light-emitting element according to a comparative example.
Figure 18:
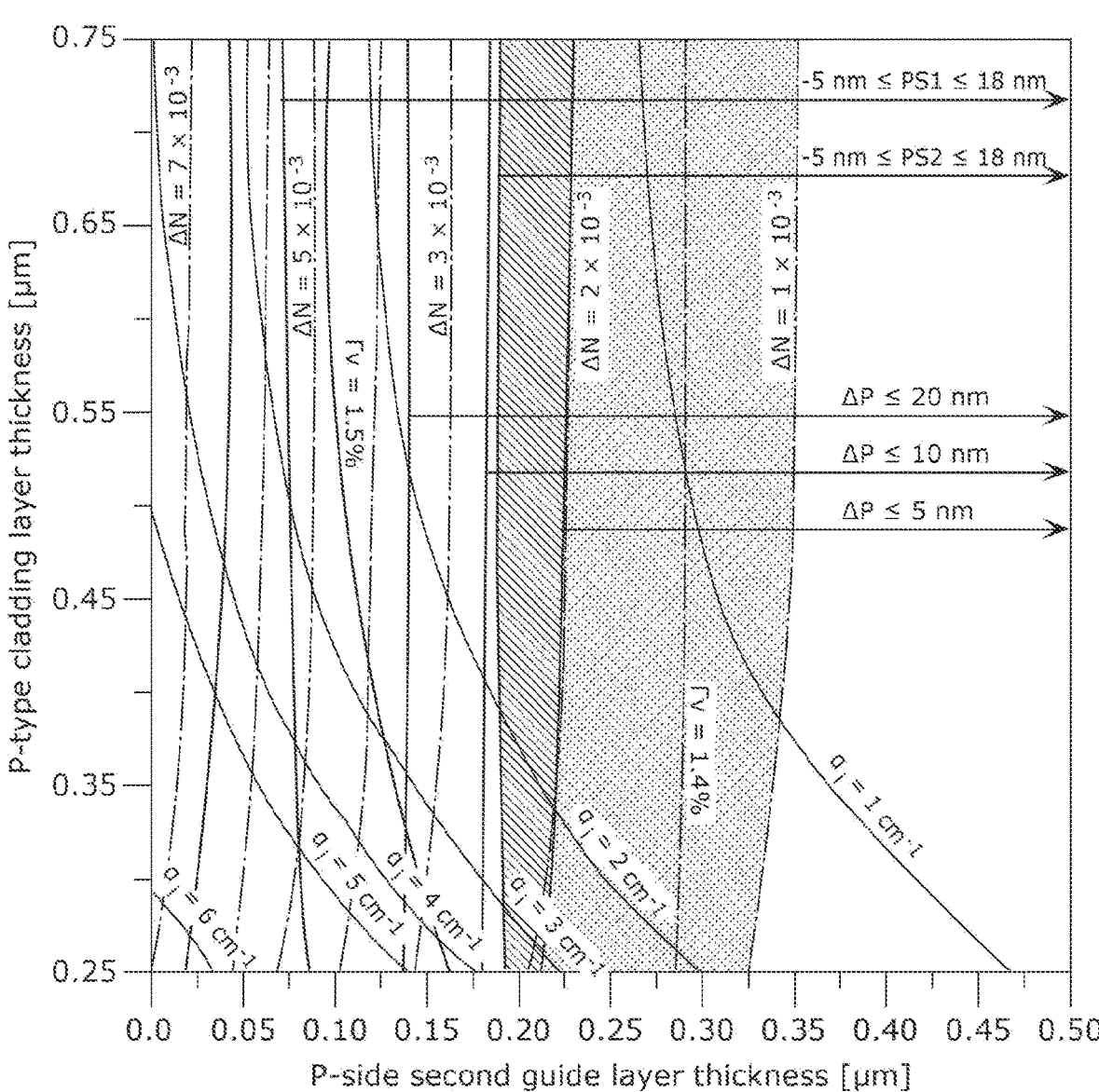
FIG. 18 is a graph illustrating the relationship between the thickness of the P-side second guide layer, the thickness of a P-type cladding layer, and each parameter of the nitride semiconductor light-emitting element according to Embodiment 1.

Next, the relationship between thickness Tp2 of P-side second guide layer 107, the thickness of P-type cladding layer 110, and each parameter of nitride semiconductor light-emitting element 100 according to the present embodiment will be explained in comparison with a comparative example, with reference to FIG. 17 and FIG. 18. FIG. 17 is a graph illustrating the relationship between the thickness of the P-side second guide layer, the thickness of the P-type cladding layer, and each parameter of a nitride semiconductor light-emitting element according to a comparative example. FIG. 18 is a graph illustrating the relationship between the thickness of P-side second guide layer 107, the thickness of P-type cladding layer 110, and each parameter of nitride semiconductor light-emitting element 100 according to the present embodiment. In FIG. 17 and FIG. 18, the relationships between each thickness and waveguide loss $a_i$, optical confinement factor $\lceil$v, and effective refractive index difference $\Delta$N are shown as contour lines. The comparative example illustrated in FIG. 17 includes a single N-side guide layer and a single P-side guide layer having the same thickness and In composition ratio, just like the nitride semiconductor light-emitting element according to Comparative Example 2 described above.

In FIG. 17, the region in the nitride semiconductor light-emitting element according to the comparative example where positions PS1 and PS2 are both between −5 nm and 18 nm, inclusive, and $\Delta$P is 20 nm or less is hatched. However, in this region, since effective refractive index difference $\Delta$N is larger than $4\times10^{-3}$, the divergence angle of the emitted light in the horizontal direction cannot be inhibited. In this region, it is not possible to make $\Delta$P less than or equal to 10 nm. In the nitride semiconductor light-emitting element according to the comparative example, although effective refractive index difference $\Delta$N can be set to $3\times10^{-3}$ or less by setting distance dc to approximately 80 nm, in this case, as described above, current leaks to between electron barrier layer 109 and trenches 110T, which increases the oscillation threshold current and decreases the temperature characteristics of the nitride semiconductor light-emitting element. Thus, the nitride semiconductor light-emitting element according to the comparative example cannot overcome the technical problem of the present disclosure.

In FIG. 18, regions in nitride semiconductor light-emitting element 100 according to the present embodiment where positions PS1 and PS2 are both between −5 nm and 18 nm, inclusive, and ΔP is 20 nm or less are hatched with diagonal lines and dots. Specifically, the region where ΔP is 5 nm or less is the region hatched with dots, and the region where ΔP is greater than 5 nm and less than or equal to 10 nm is the region hatched with diagonal lines. As illustrated in FIG. 18, in the hatched regions, effective refractive index difference ΔN is $2.8 \times 10^{-3}$ or less. Therefore, in nitride semiconductor light-emitting element 100 according to the present embodiment, each of the above conditions can be satisfied even if distance dc is approximately 40 nm.

Embodiment 2

The nitride semiconductor light-emitting element according to Embodiment 2 will be described. The nitride semiconductor light-emitting element according to the present embodiment differs from nitride semiconductor light-emitting element 100 according to Embodiment 1 in regard to the relationship between the Al composition ratios of the N-type first cladding layer and the P-type cladding layer. Hereinafter, the nitride semiconductor light-emitting element according to the present embodiment will be described with reference to FIG. 19, focusing on the differences from nitride semiconductor light-emitting element 100 according to Embodiment 1.

Figure 19:
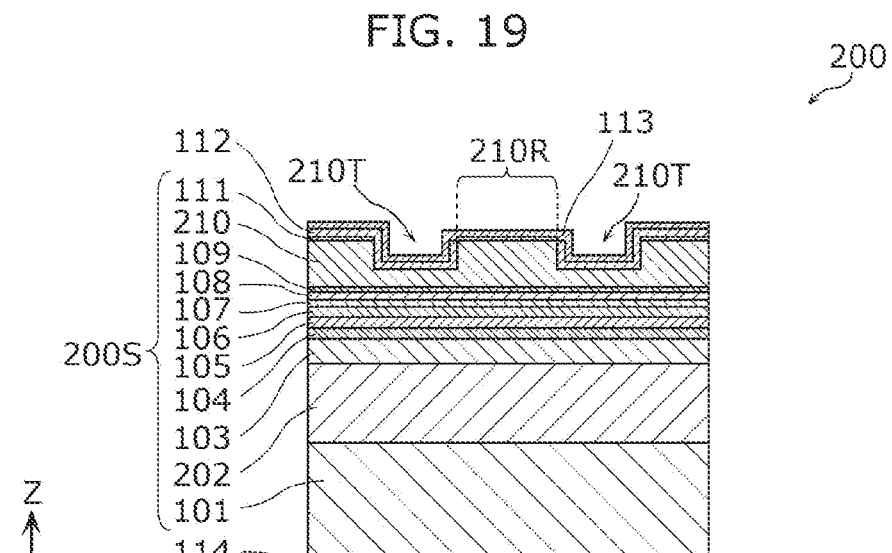
FIG. 19 is a cross-sectional view of the overall configuration of a nitride semiconductor light-emitting element according to Embodiment 2.

FIG. 19 is a schematic cross-sectional view of the overall configuration of nitride semiconductor light-emitting element 200 according to the present embodiment. As illustrated in FIG. 19, nitride semiconductor light-emitting element 200 according to the present embodiment includes semiconductor stack 200S, current blocking layer 112, P-side electrode 113, and N-side electrode 114. Semiconductor stack 200S includes substrate 101, N-type first cladding layer 202, N-type second cladding layer 103, N-side guide layer 104, active layer 105, P-side first guide layer 106, P-side second guide layer 107, intermediate layer 108, electron barrier layer 109, P-type cladding layer 210, contact layer 111.

N-type first cladding layer 202 according to the present embodiment is an N-type $Al_{0.036}Ga_{0.964}N$ layer with a thickness of 1200 nm. N-type first cladding layer 202 is doped with Si at a concentration of $1 \times 10^{18}$ $cm^{-3}$ as an impurity.

P-type cladding layer 210 according to the present embodiment is a P-type $Al_{0.026}Ga_{0.974}N$ layer with a thickness of 450 nm. P-type cladding layer 210 is doped with Mg as an impurity. The impurity concentration of P-type cladding layer 210 is lower at the end portion closer to active layer 105 than at the end portion farther from active layer 105. More specifically, P-type cladding layer 210 includes a 150 nm thick P-type $Al_{0.026}Ga_{0.974}N$ layer doped with Mg at a concentration of $2 \times 10^{18}$ $cm^{-3}$ arranged on the side closer to active layer 105, and a 300 nm thick P-type $Al_{0.026}Ga_{0.974}N$ layer doped with Mg at a concentration of $1 \times 10^{19}$ $cm^{-3}$ arranged on the side farther from active layer 105.

In P-type cladding layer 210, ridge 210R is formed in the same way as in P-type cladding layer 110 according to Embodiment 1. Two trenches 210T disposed along ridge 210R and extending in the Y-axis direction are also formed in P-type cladding layer 210.

Nitride semiconductor light-emitting element 200 according to the present embodiment achieves the same advantageous effects as nitride semiconductor light-emitting element 100 according to Embodiment 1.

Furthermore, in the present embodiment, N-type first cladding layer 202 and P-type cladding layer 210 include Al, and Ync>Ypc (Expression 10), where Ync is the Al composition ratio of N-type first cladding layer 202 and Ypc is the Al composition ratio of P-type cladding layer 210.

If at least one of N-type first cladding layer 202 or P-type cladding layer 210 is a superlattice structure, composition ratios Ync and Ypc indicate the average Al composition ratio. For example, if N-type first cladding layer 202 includes a plurality of 2 nm thick GaN layers and a plurality of 2 nm thick AlGaN layers with an Al composition ratio of 0.07, and the plurality of GaN layers and the plurality of AlGaN layers are alternately stacked, Ync is the average Al composition ratio across the entirety of N-type first cladding layer 202, which is 0.035. When P-type cladding layer 210 includes a plurality of 2 nm thick GaN layers and a plurality of 2 nm thick AlGaN layers with an Al composition ratio of 0.07, and the plurality of GaN layers and the plurality of AlGaN layers are alternately stacked, Ypc is the average Al composition ratio across the entirety of P-type cladding layer 210, which is 0.035.

This allows the refractive index of N-type first cladding layer 202 to be reduced below the refractive index of P-type cladding layer 210. Therefore, even if the thickness of P-type cladding layer 210 is reduced in order to reduce the operating voltage of nitride semiconductor light-emitting element 200, the refractive index of N-type first cladding layer 202 is smaller than the refractive index of P-type cladding layer 210, so the peak of the light intensity distribution in the stacking direction can be inhibited from moving toward N-type first cladding layer 202 from active layer 105.

According to the present embodiment, it is possible to realize nitride semiconductor light-emitting element 200 characterized by effective refractive index difference ΔN of $2.5 \times 10^{-3}$, position PS1 of the peak of the light intensity distribution in the stacking direction in the portion below ridge 210R of 2.5 nm, ΔP of 6.4 nm, an optical confinement factor of active layer 105 of 1.45%, and a waveguide loss of 1.9 $cm^{-1}$.

Embodiment 3

The nitride semiconductor light-emitting element according to Embodiment 3 will be described. The nitride semiconductor light-emitting element according to the present embodiment differs from nitride semiconductor light-emitting element 200 according to Embodiment 2 in that it includes a light-transmissive conductive film on contact layer 111 of ridge 210R. Hereinafter, the nitride semiconductor light-emitting element according to the present embodiment will be described with reference to FIG. 20, focusing on the differences from nitride semiconductor light-emitting element 200 according to Embodiment 2.

Figure 20:
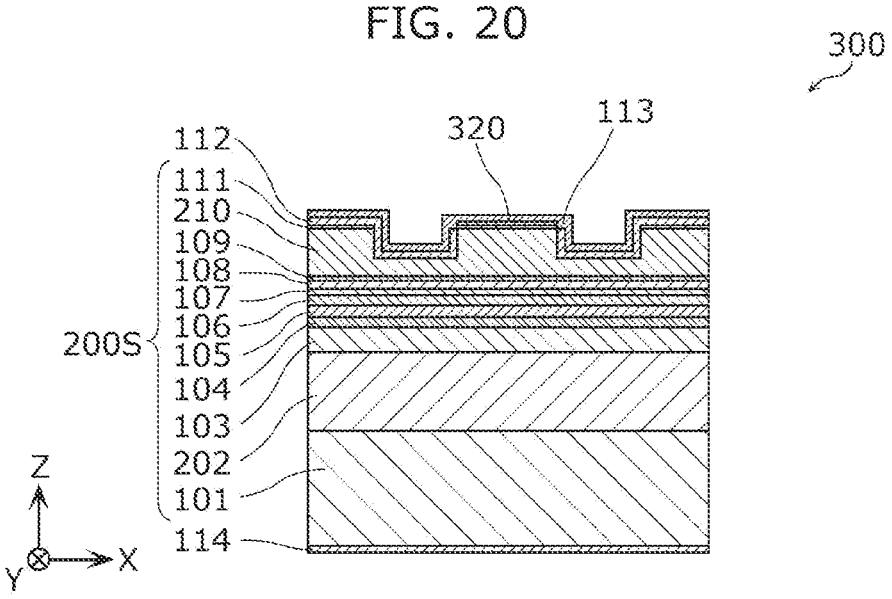
FIG. 20 is a cross-sectional view of the overall configuration of a nitride semiconductor light-emitting element according to Embodiment 3.

FIG. 20 is a schematic cross-sectional view of the overall configuration of nitride semiconductor light-emitting element 300 according to the present embodiment. As illustrated in FIG. 20, nitride semiconductor light-emitting element 300 according to the present embodiment includes semiconductor stack 200S, current blocking layer 112, P-side electrode 113, N-side electrode 114, and light-transmissive conductive film 320.

Light-transmissive conductive film 320 according to the present embodiment is a conductive film that is disposed above P-type cladding layer 210 and transmits at least a portion of the light generated by nitride semiconductor light-emitting element 300. For example, an oxide film that is light-transmissive to visible light and exhibits low-resistance electrical conductivity, such as tin-doped indium oxide (ITO), Ga-doped zinc oxide, Al-doped zinc oxide, and In- and Ga-doped zinc oxide can be used as light-transmissive conductive film 320.

Nitride semiconductor light-emitting element 300 according to the present embodiment achieves the same advantageous effects as nitride semiconductor light-emitting element 200 according to Embodiment 2.

Furthermore, in the present embodiment, since light-transmissive conductive film 320 disposed above P-type cladding layer 210 is included, loss of light propagating above P-type cladding layer 210 can be reduced. In addition, since the thickness of P-type cladding layer 210 can be further reduced, the electrical resistance of nitride semiconductor light-emitting element 300 can be further reduced. As a result, the slope efficiency of nitride semiconductor light-emitting element 300 can be increased and the operating voltage can be reduced.

According to the present embodiment, it is possible to realize nitride semiconductor light-emitting element 300 characterized by effective refractive index difference $\Delta N$ of $2.1 \times 10^{-3}$, position PS1 of the peak of the light intensity distribution in the stacking direction in the portion below ridge 210R of 2.0 nm, $\Delta P$ of 5.7 nm, an optical confinement factor of active layer 105 of 1.47%, and a waveguide loss of 1.9 cm$^{-1}$.

Embodiment 4

The nitride semiconductor light-emitting element according to Embodiment 4 will be described. The nitride semiconductor light-emitting element according to the present embodiment differs from nitride semiconductor light-emitting element 200 according to Embodiment 2 in regard to the configuration of the active layer. Hereinafter, the nitride semiconductor light-emitting element according to the present embodiment will be described with reference to FIG. 21A and FIG. 21B, focusing on the differences from nitride semiconductor light-emitting element 200 according to Embodiment 2.

Figure 21A:
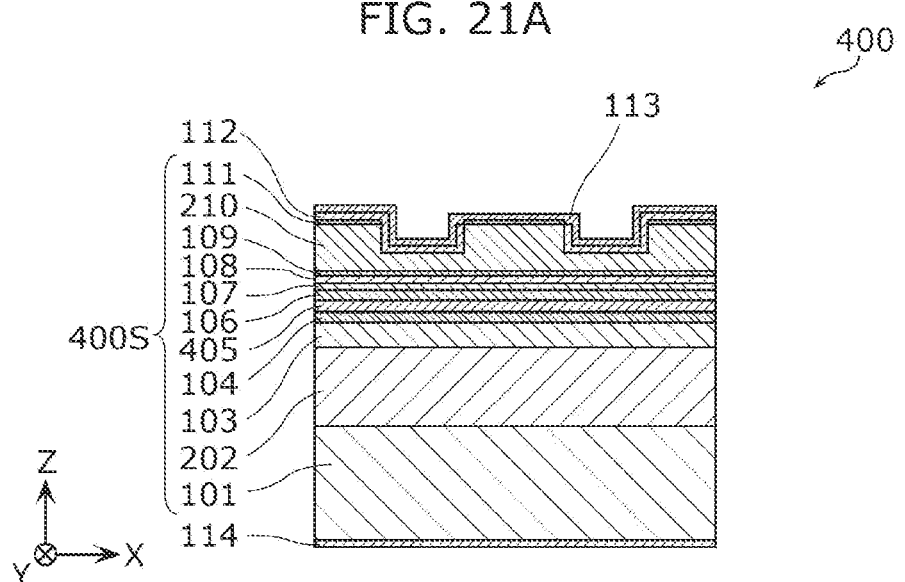
FIG. 21A is a cross-sectional view of the overall configuration of a nitride semiconductor light-emitting element according to Embodiment 4.
Figure 21B:
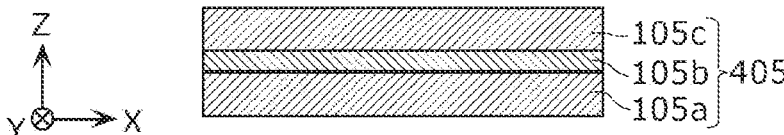
FIG. 21B is a cross-sectional view illustrating the configuration of an active layer included in the nitride semiconductor light-emitting element according to Embodiment 4.

FIG. 21A is a schematic cross-sectional view of the overall configuration of nitride semiconductor light-emitting element 400 according to the present embodiment. FIG. 21B is a cross-sectional view illustrating the configuration of active layer 405 included in nitride semiconductor light-emitting element 400 according to the present embodiment.

As illustrated in FIG. 21A, nitride semiconductor light-emitting element 400 according to the present embodiment includes semiconductor stack 400S, current blocking layer 112, P-side electrode 113, and N-side electrode 114. Semiconductor stack 400S includes substrate 101, N-type first cladding layer 202, N-type second cladding layer 103, N-side guide layer 104, active layer 405, P-side first guide layer 106, P-side second guide layer 107, intermediate layer 108, electron barrier layer 109, P-type cladding layer 210, contact layer 111.

As illustrated in FIG. 21B, active layer 405 according to the present embodiment has a single quantum well structure, and includes a single well layer 105b and barrier layers 105a and 105c that sandwich well layer 105b. Well layer 105b has the same configuration as well layer 105b according to Embodiment 1, and barrier layers 105a and 105c have same configuration as barrier layers 105a and 105c according to Embodiment 1.

Nitride semiconductor light-emitting element 400 according to the present embodiment achieves the same advantageous effects as nitride semiconductor light-emitting element 200 according to Embodiment 2. In particular, in nitride semiconductor light-emitting element 400 having a single quantum well structure as described above, active layer 405 includes a single well layer 105b. Thus, even in nitride semiconductor light-emitting element 400 including a small number of well layers 105b with a large refractive index, the peak of the light intensity distribution in the stacking direction can be located in or near active layer 405 due to the configurations of N-side guide layer 104, P-side first guide layer 106, P-side second guide layer 107, etc. The optical confinement factor can therefore be increased.

According to the present embodiment, it is possible to realize nitride semiconductor light-emitting element 400 characterized by effective refractive index difference $\Delta N$ of $2.5 \times 10^{-3}$, position PS1 of the peak of the light intensity distribution in the stacking direction in the portion below ridge 210R of 2.1 nm, $\Delta P$ of 6.3 nm, an optical confinement factor of active layer 405 of 0.72%, and a waveguide loss of 1.8 cm$^{-1}$. In the present embodiment, since the total thickness of active layer 405 is 8 nm smaller than active layer 105 according to Embodiment 2, the optical confinement factor is smaller than in Embodiment 2.

(Variations, etc.)

Although the nitride semiconductor light-emitting element according to the present disclosure has been described based on embodiments, the present disclosure is not limited to the above embodiments.

For example, each of the above embodiments gives an example in which the nitride semiconductor light-emitting element is a semiconductor laser element, but the nitride semiconductor light-emitting element is not limited to a semiconductor laser element. For example, the nitride semiconductor light-emitting element may be a superluminescent diode. In such cases, the reflectance of the end face of the semiconductor stack included in the nitride semiconductor light-emitting element with respect to the light emitted from the semiconductor stack may be 0.1% or less. For example, such reflectance can be achieved by forming an anti-reflective film including, for example, a dielectric multilayer film on the end face. Alternatively, if the ridge that serves as the waveguide is inclined at an angle of 5° or more from the normal direction of the front end face and intersects the front end face in an inclined stripe structure, the ratio of the component of guided light reflected off the front end face that combines with the waveguide and becomes guided light again can be reduced to a small value of 0.1% or less.

In Embodiments 1 through 3, in the nitride semiconductor light-emitting element, active layer 105 has a structure including two well layers, but active layer 105 may have a structure including only a single well layer. Thus, even when there is only one well layer with a high refractive index in the active layer, using N-side guide layer 104, P-side first guide layer 106, and P-side second guide layer 107 according to the present disclosure can improve the controllability of the position of the light distribution in the vertical direction, so the peak of the light distribution in the vertical direction can be positioned near the well layer. Thus, a nitride semiconductor light-emitting element with a low oscillation threshold, low waveguide loss, a high optical confinement factor, and current-light output (IL) characteristics with excellent linearity can be realized.

Figure 22:
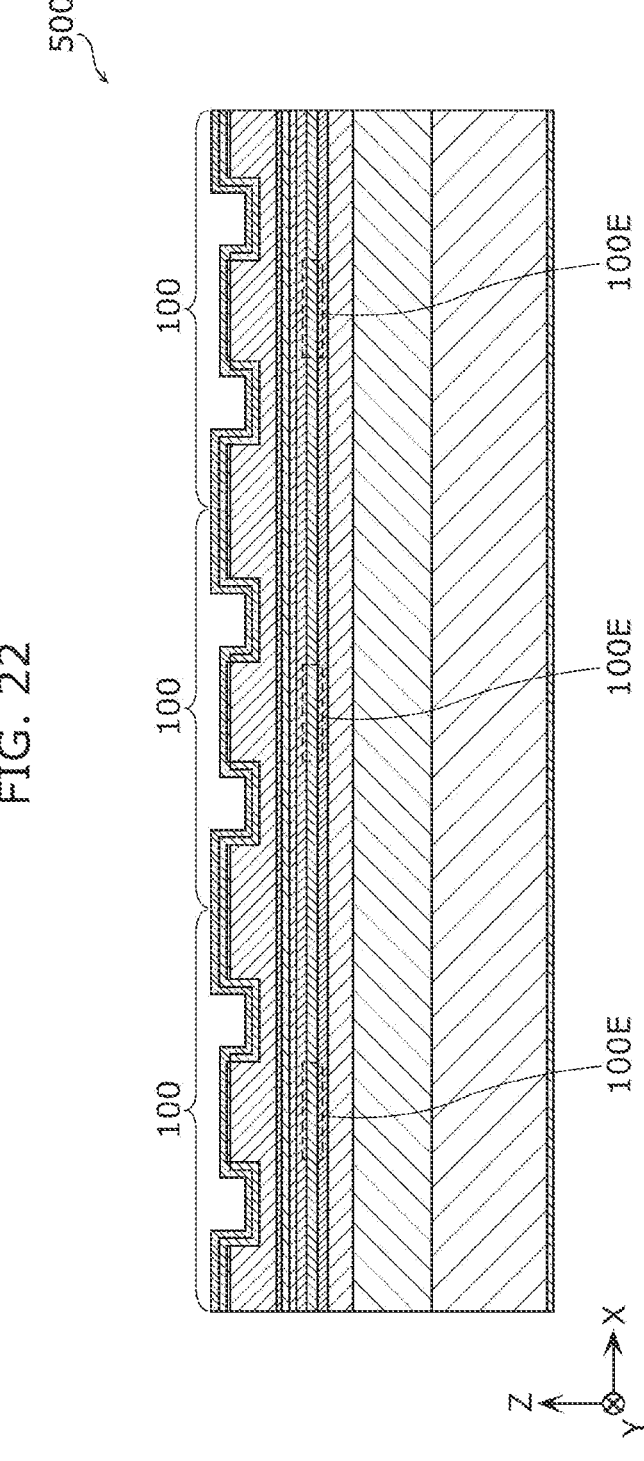
FIG. 22 is a schematic cross-sectional view of the overall configuration of a nitride semiconductor light-emitting element according to Variation 1.

In each of the above embodiments, the nitride semiconductor light-emitting element is exemplified as including a single ridge, but the nitride semiconductor light-emitting element may include a plurality of ridges. Such a nitride semiconductor light-emitting element will be described with reference to FIG. 22. FIG. 22 is a schematic cross-sectional view of the overall configuration of nitride semiconductor light-emitting element 500 according to Variation 1. As illustrated in FIG. 22, nitride semiconductor light-emitting element 500 according to Variation 1 has a configuration in which a plurality of nitride semiconductor light-emitting elements 100 according to Embodiment 1 are arrayed in the horizontal direction. In FIG. 22, nitride semiconductor light-emitting element 500 has a configuration in which three nitride semiconductor light-emitting elements 100 are integrally arrayed, but the number of nitride semiconductor light-emitting elements 100 included in nitride semiconductor light-emitting element 500 is not limited to three. The number of nitride semiconductor light-emitting elements 100 included in nitride semiconductor light-emitting element 500 may be two or more. Each nitride semiconductor light-emitting element 100 includes light-emitting portion 100E that emits light. Light-emitting portion 100E is the portion of active layer 105 that emits light, and corresponds to the portion of active layer 105 located below ridge 110R. Thus, nitride semiconductor light-emitting element 500 according to Variation 1 includes a plurality of linearly arrayed light-emitting portions 100E. With this configuration, a plurality of beams of emitted light can be obtained from a single nitride semiconductor light-emitting element 500, thus realizing a high-output nitride semiconductor light-emitting element 500. In Variation 1, although nitride semiconductor light-emitting element 500 includes a plurality of nitride semiconductor light-emitting elements 100, the plurality of nitride semiconductor light-emitting elements that nitride semiconductor light-emitting element 500 includes is not limited to this example; nitride semiconductor light-emitting element 500 may include nitride semiconductor light-emitting elements according to any other embodiment.

Figure 23:
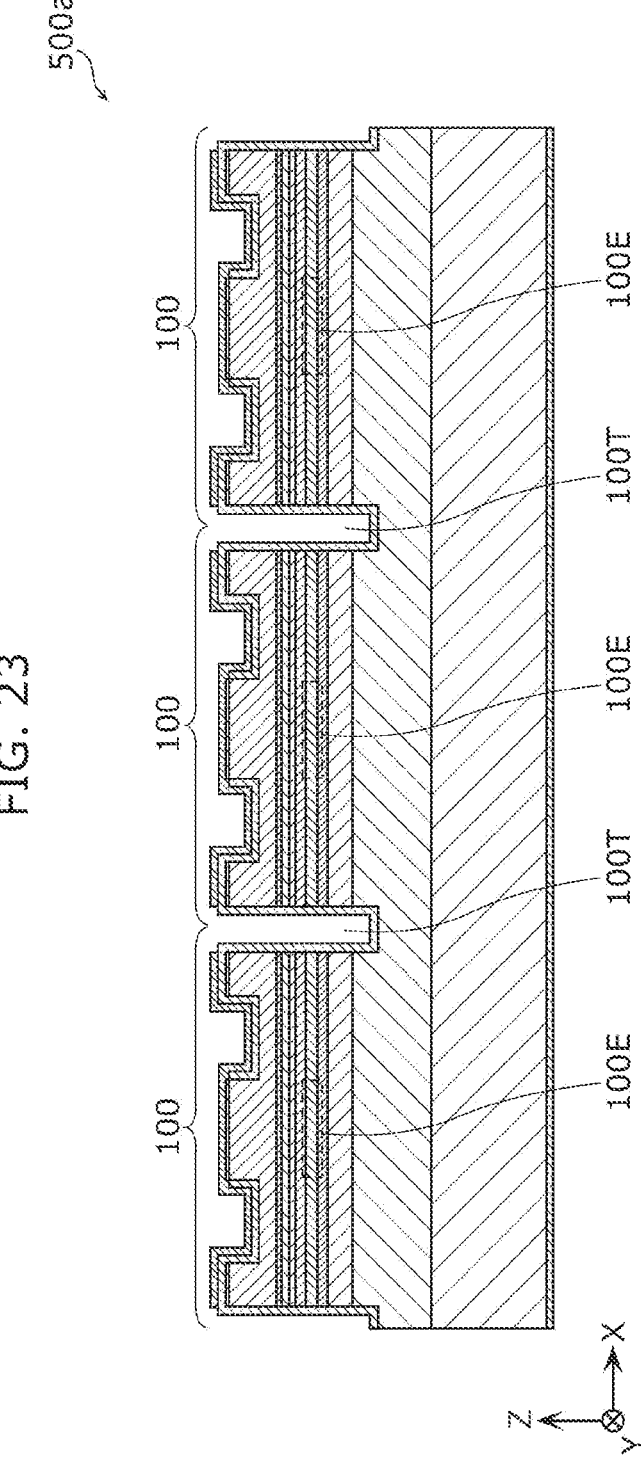
FIG. 23 is a schematic cross-sectional view of the overall configuration of a nitride semiconductor light-emitting element according to Variation 2.

As in nitride semiconductor light-emitting element 500a according to Variation 2 illustrated in FIG. 23, individual light-emitting portions 100E may be separated by isolation trench 100T having a width (a dimension in the X-axis direction) of 8 μm to 20 μm, inclusive, and a depth (a dimension in the Z-axis direction) of 1.0 μm to 1.5 μm, inclusive. By adopting such a structure, thermal interference due to self-heating during operation of individual light-emitting portions 100E can be reduced even when the distance between adjacent light-emitting portions 100E is 300 μm or less.

Since ΔN in the nitride semiconductor light-emitting element according to the present invention is small and the horizontal divergence angle can be reduced, even if the distance between the centers of light-emitting portions 100E illustrated in FIG. 22 and FIG. 23 is short, the light emitted from individual light-emitting portions 100E is not likely to interfere with each other, so the distance between the centers of light-emitting portions 100E can be reduced to 250 μm or less. In Variation 2, the distance is 225 μm.

In each of the embodiments, the nitride semiconductor light-emitting element is exemplified as including N-type second cladding layer 103, intermediate layer 108, electron barrier layer 109, and current blocking layer 112, but the nitride semiconductor light-emitting element does not necessarily need to include these layers.

Those skilled in the art will readily appreciate that various modifications may be made in these embodiments and that other embodiments may be obtained by arbitrarily combining the elements and functions of the embodiments without materially departing from the novel teachings and advantages of the present disclosure. Accordingly, all such modifications and other embodiments are included in the present disclosure.

For example, the configuration of each cladding layer according to Embodiment 1 may be applied to the nitride semiconductor light-emitting elements according to Embodiments 3 and 4. As another example, the light-transmissive conductive film according to Embodiment 3 may be applied to the nitride semiconductor light-emitting elements of Embodiments 1 and 4.

INDUSTRIAL APPLICABILITY

The nitride semiconductor light-emitting element according to the present disclosure can be applied to, for example, a light source for processing machines, as a high-output, high-efficiency light source.

The invention claimed is:

1. A nitride semiconductor light-emitting element that comprises a semiconductor stack and emits light from an end face of the semiconductor stack, the end face being perpendicular to a stacking direction of the semiconductor stack, wherein the semiconductor stack includes:
  an N-type first cladding layer;
  an N-side guide layer disposed above the N-type first cladding layer;
  an active layer disposed above the N-side guide layer;
  a P-side first guide layer disposed above the active layer;
  a P-side second guide layer disposed above the P-side first guide layer; and
  a P-type cladding layer disposed above the P-side second guide layer,
a band gap energy of the P-side second guide layer is larger than a band gap energy of the N-side guide layer,
the band gap energy of the N-side guide layer is larger than or equal to a band gap energy of the P-side first guide layer,
$Tn1 < Tp1 + Tp2$, where $Tp1$ is a thickness of the P-side first guide layer, $Tp2$ is a thickness of the P-side second guide layer, and $Tn1$ is a thickness of the N-side guide layer,
the P-side first guide layer includes $In_{Xp1}Ga_{1-Xp1}N$,
the N-side guide layer includes $In_{Xn1}Ga_{1-Xn1}N$,
$Xn1 \leq Xp1$,
the P-side second guide layer includes $In_{Xp2}Ga_{1-Xp2}N$, and
$Xp2 \leq Xn1$.

2. The nitride semiconductor light-emitting element according to claim 1, wherein
an average refractive index of the P-side first guide layer and the P-side second guide layer is less than an average refractive index of the N-side guide layer.

3. The nitride semiconductor light-emitting element according to claim 1, wherein
$Xn1 < Xp1$.

4. The nitride semiconductor light-emitting element according to claim 1, wherein
the active layer has a quantum well structure including a well layer and a barrier layer,
the barrier layer includes $In_{Xb}Ga_{1-Xb}N$, and
$Xp1 < Xb$.

5. The nitride semiconductor light-emitting element according to claim 1, wherein the band gap energy of the N-side guide layer is larger than the band gap energy of the P-side first guide layer.

6. The nitride semiconductor light-emitting element according to claim 1, wherein Tp1<Tp2.

7. The nitride semiconductor light-emitting element according to claim 1, wherein Tp1<Tn1.

8. The nitride semiconductor light-emitting element according to claim 1, wherein a peak of a light intensity distribution in the stacking direction is located in the active layer.

9. The nitride semiconductor light-emitting element according to claim 1, wherein an impurity concentration of the P-type cladding layer is lower at an end portion closer to the active layer than at an end portion farther from the active layer.

10. The nitride semiconductor light-emitting element according to claim 1, comprising:

an electron barrier layer disposed between the P-side second guide layer and the P-type cladding layer, wherein the electron barrier layer includes an Al composition variation region in which an Al composition ratio monotonically increases with increasing distance from the active layer.

11. The nitride semiconductor light-emitting element according to claim 1, wherein the N-type first cladding layer and the P-type cladding layer include Al, and Ync>Ypc, where Ync is an Al composition ratio of the N-type first cladding layer and Ypc is an Al composition ratio of the P-type cladding layer.

12. The nitride semiconductor light-emitting element according to claim 1, wherein a thickness of the P-type cladding layer is 460 nm or less.

13. The nitride semiconductor light-emitting element according to claim 1, comprising:

a light-transmissive conductive film disposed above the P-type cladding layer.

14. The nitride semiconductor light-emitting element according to claim 1, comprising:

an N-type second cladding layer disposed between the N-type first cladding layer and the N-side guide layer, wherein a band gap energy of the N-type second cladding layer is smaller than a band gap energy of the N-type first cladding layer and larger than the band gap energy of the P-side second guide layer.

15. The nitride semiconductor light-emitting element according to claim 1, comprising:

a plurality of light-emitting portions arranged in a linear array.

16. The nitride semiconductor light-emitting element according to claim 1, wherein a reflectance of the end face of the semiconductor stack is 0.1% or less.

17. The nitride semiconductor light-emitting element according to claim 1, comprising:

a P-side electrode disposed above the semiconductor stack, wherein the P-side electrode includes Ag.

18. A nitride semiconductor light-emitting element that comprises a semiconductor stack and emits light from an end face of the semiconductor stack, the end face being perpendicular to a stacking direction of the semiconductor stack, wherein the semiconductor stack includes:

an N-type first cladding layer;

an N-side guide layer disposed above the N-type first cladding layer;

an active layer disposed above the N-side guide layer, having a quantum well structure including a well layer and a barrier layer;

a P-side first guide layer disposed above the active layer;

a P-side second guide layer disposed above the P-side first guide layer; and a P-type cladding layer disposed above the P-side second guide layer, a band gap energy of the P-side second guide layer is larger than a band gap energy of the N-side guide layer, the band gap energy of the N-side guide layer is larger than or equal to a band gap energy of the P-side first guide layer, Tn1<Tp1+Tp2, where Tp1 is a thickness of the P-side first guide layer, Tp2 is a thickness of the P-side second guide layer, and Tn1 is a thickness of the N-side guide layer, the P-side first guide layer includes InXp1Ga1-Xp1N, the N-side guide layer includes InXn1Ga1-Xn1N, Xn1≤Xp1, the P-side second guide layer includes InXp2Ga1-Xp2N, and Xp2<Xn1.

19. The nitride semiconductor light-emitting element according to claim 18, comprising:

a light-transmissive conductive film disposed above the P-type cladding layer.

20. The nitride semiconductor light-emitting element according to claim 18, comprising:

a P-side electrode disposed above the semiconductor stack, wherein the P-side electrode includes Ag.

* * * * *